US012777905B2

(12) United States Patent
Lai et al.

(10) Patent No.: US 12,777,905 B2
(45) Date of Patent: Oct. 27, 2026

(54) SEMICONDUCTOR DEVICE AND METHODS OF FORMATION VIA ETCHING OPERATIONS

(71) Applicant: Taiwan Semiconductor Manufacturing Company, Ltd., Hsinchu (TW)

(72) Inventors: Ying-Yu Lai, Taipei (TW); Chih-Yun Wang, Kaohsiung City (TW); Chih-Hsuan Lin, Hsinchu City (TW); Hsi Chung Chen, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 750 days.

(21) Appl. No.: 17/660,518

(22) Filed: Apr. 25, 2022

(65) Prior Publication Data

US 2023/0343637 A1 Oct. 26, 2023

(51) Int. Cl.

*H10W 20/00* (2026.01)
*H10D 30/62* (2025.01)

(Continued)

(52) U.S. Cl.

CPC .......... *H10W 20/081* (2026.01); *H10D 64/01* (2025.01); *H10D 64/258* (2025.01); *H10D 84/0149* (2025.01); *H10D 84/038* (2025.01); *H10P 50/283* (2026.01); *H10P 50/285* (2026.01); *H10P 50/73* (2026.01); *H10P 70/234* (2026.01); *H10W 20/42* (2026.01); *H10W 20/435* (2026.01); *H10D 30/6219* (2025.01);

(Continued)

(58) Field of Classification Search

CPC ......... H01L 21/76814; H01L 21/02063; H01L 21/31116; H01L 21/31122; H01L 21/31144; H01L 23/5226; H01L 23/5283; H10D 64/258; H10D 64/01; H10D 84/038; H10D 84/0149; H10D 84/0158; H10D 84/834; H10D 30/6735; H10D 30/6219; H10D 84/83; H10W 20/081; H10W 20/42; H10W 20/435; H10P 50/73; H10P 50/285; H10P 50/283; H10P 70/234

See application file for complete search history.

(56) References Cited

U.S. PATENT DOCUMENTS

| | | | |
|---|---|---|---|
| 8,962,490 | B1 | 2/2015 | Hung et al. |
| 9,761,488 | B2 | 9/2017 | Cheng et al. |

(Continued)

FOREIGN PATENT DOCUMENTS

| | | | |
|---|---|---|---|
| CN | 106356332 | A | 1/2017 |
| CN | 106356449 | A | 1/2017 |

(Continued)

*Primary Examiner* — Norman D Richards
*Assistant Examiner* — Sean Ayers Winters
(74) *Attorney, Agent, or Firm* — Harrity & Harrity, LLP

(57) ABSTRACT

Multiple dry etching operations are performed to form an opening for an interconnect structure, with a wet cleaning operation performed in between the dry etching operations. This multi-step etch approach increases the effectiveness of residual material removal, which increases the quality of the interconnect structure and reduces the likelihood of under etching, both of which increase semiconductor device yield and semiconductor device performance.

20 Claims, 35 Drawing Sheets

1100

(51) Int. Cl.

| | |
|---|---|
| ***H10D 30/67*** | (2025.01) |
| ***H10D 64/01*** | (2025.01) |
| ***H10D 64/23*** | (2025.01) |
| ***H10D 84/01*** | (2026.01) |
| ***H10D 84/03*** | (2025.01) |
| ***H10D 84/83*** | (2025.01) |
| ***H10P 50/00*** | (2026.01) |
| ***H10P 50/28*** | (2026.01) |
| ***H10P 70/00*** | (2026.01) |
| ***H10W 20/41*** | (2026.01) |
| ***H10W 20/42*** | (2026.01) |

(52) U.S. Cl.
CPC ..... *H10D 30/6735* (2025.01); *H10D 84/0158* (2025.01); *H10D 84/83* (2025.01); *H10D 84/834* (2025.01)

(56) References Cited

U.S. PATENT DOCUMENTS

2005/0142800 A1* 6/2005 Choi ................. H01L 21/76235 438/424
2007/0231930 A1* 10/2007 Funk ....................... H01L 22/12 257/E21.53
2008/0111202 A1 5/2008 Dyer et al.
2010/0244247 A1* 9/2010 Chang ............... H01L 21/76898 257/E21.585
2010/0311243 A1* 12/2010 Mao ....................... H10N 50/01 438/694
2011/0057272 A1* 3/2011 Kurahashi ......... H01L 21/28587 257/410
2012/0289043 A1 11/2012 Hsieh et al.
2015/0097252 A1* 4/2015 Flachowsky ...... H01L 21/28088 438/287
2017/0018706 A1* 1/2017 Xue ....................... H10N 50/01
2017/0316981 A1* 11/2017 Chen .................. H10D 84/0149
2017/0352619 A1* 12/2017 Li ..................... H01L 21/76877
2021/0082770 A1 3/2021 Xie et al.
2021/0193534 A1 6/2021 Chen et al.

FOREIGN PATENT DOCUMENTS

CN 107452614 A 12/2017
TW 200644072 A 12/2006
TW 201044459 A 12/2010

* cited by examiner

SEMICONDUCTOR DEVICE AND METHODS OF FORMATION VIA ETCHING OPERATIONS

BACKGROUND

An electronic device (e.g., a processor, a memory) may include various intermediate and backend layers or regions in which individual semiconductor devices (e.g., transistors, capacitors, resistors) are interconnected by interconnect structures. The interconnect structures may include metallization layers (also referred to as wires), vias that connect the metallization layers, contact plugs, and/or trenches, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
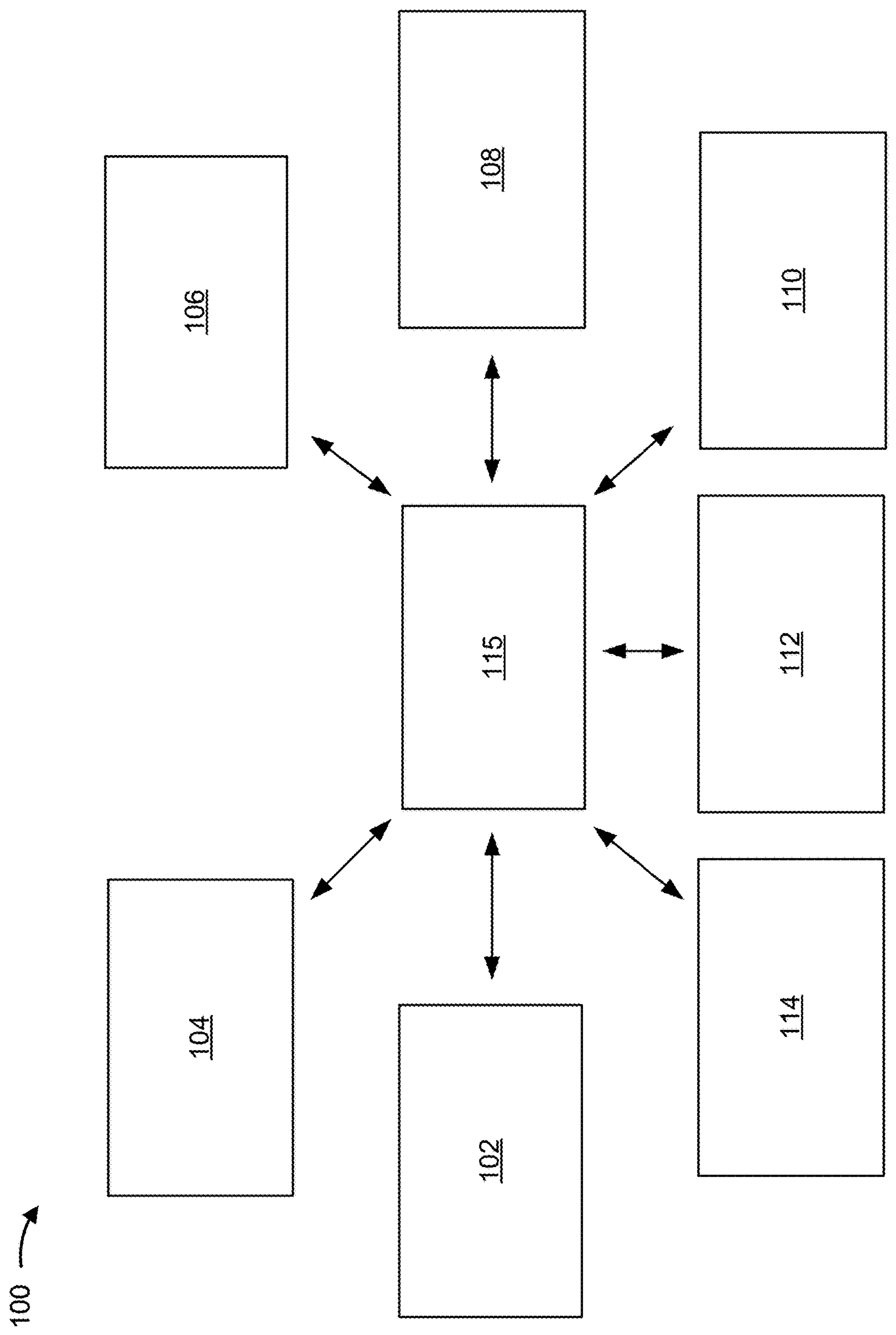
FIGS. 1A and 1B are diagrams of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When forming an interconnect structure, an opening may be formed through one or more layers and to a structure (e.g., a gate structure, a sourced/drain region, a contact) that is to be electrically connected to the interconnect structure. Residual materials and/or native oxides may form in the opening after formation and prior to filling the opening with liners, barrier layers, and/or conductive material to form the interconnect structure. These residual materials and/or native oxides may increase contact resistance and/or may cause void formation in the interconnect. Moreover, the residual materials and/or native oxides may propagate into neighboring layers which can affect the etch rates of the neighboring layers. This may result in under etching of the neighboring layers and/or increased difficulty in removing the neighboring layers, which may decrease semiconductor device yield.

In some cases, multiple operations may be performed to form an interconnect structure and/or to remove residual materials and/or native oxides from an opening prior to forming the interconnect structure for a semiconductor device. The operations may require the use of multiple chambers and/or tools and transferring the semiconductor device between the multiple chambers. This may increase equipment cost, may increase processing times for the semiconductor device, and/or may increase queue times for the semiconductor device (e.g., the amount of time the semiconductor device awaits processing). Moreover, transferring the semiconductor device between the multiple chambers may expose the semiconductor device to adverse and/or detrimental environmental conditions that can increase the likelihood of oxidation and/or other defect formation.

Some implementations described herein provide semiconductor processing techniques that increase the effectiveness of removing residual materials and/or native oxides in an opening in which an interconnect structure is to be formed for a semiconductor device. In some implementations, multiple dry etching operations are performed to form the opening, with a wet cleaning operation performed in between the dry etching operations. This multi-step etch approach increases the effectiveness of residual material removal, which increases the quality of the interconnect structure and reduces the likelihood of under etching, both of which increase semiconductor device yield and semiconductor device performance.

Moreover, a dry ashing operation is performed (e.g., to remove photoresist layers and/or hard mask layers from the semiconductor device) in the same chamber as the first dry etching operation. In this way, performing the dry ashing operation in the same chamber as the first dry etching operation enables carbon-rich polymer materials to be removed in a single chamber. Moreover, this reduces the likelihood of exposure of the semiconductor device to contaminants and/or other adverse environmental conditions that might otherwise occur when transferred between processing chambers, which reduces the likelihood of defect formation for the semiconductor device and/or increases semiconductor device yield. Performing the dry ashing operation in the same chamber as the first dry etching operation also reduces the quantity of transfers between processing chambers for the semiconductor device, which reduces queue times for the semiconductor device and reduces processing times for the semiconductor device, among other examples.

Figure 1B:
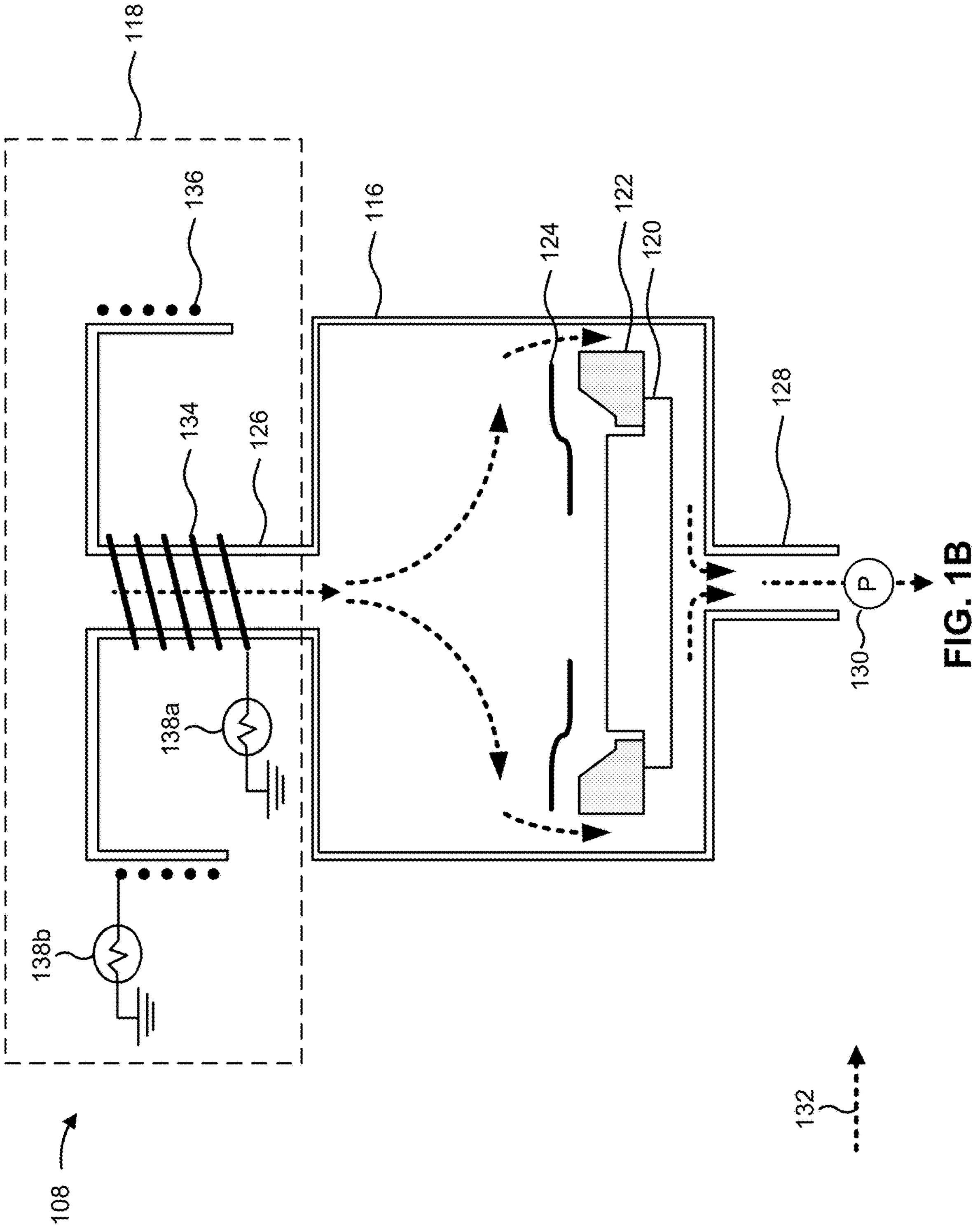

FIGS. 1A and 1B are diagrams of an example environment 100 in which systems and/or methods described herein may be implemented. As shown in FIG. 1A, environment 100 may include a plurality of semiconductor processing tools 102-114 and a wafer/die transport tool 115. The plurality of semiconductor processing tools 102-114 may include a deposition tool 102, an exposure tool 104, a developer tool 106, an etch tool 108, a planarization tool 110, a plating tool 112, a wet cleaning tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The wet cleaning tool 114 is a semiconductor processing tool that is capable of performing a cleaning operation to clean a semiconductor device and/or one or more structures thereon. The wet cleaning tool 114 may clean a semiconductor device to remove residual materials from the semiconductor device (e.g., after another semiconductor processing operation) and/or to remove native oxides and other native materials from the semiconductor device, and/or may perform another type of cleaning operation. The wet cleaning tool 114 may clean a semiconductor device using one or more wet chemicals described herein.

Wafer/die transport tool 115 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 115 may be a programmed device that is configured to travel a particular path and/or may operate semi-autonomously or autonomously. In some implementations, the semiconductor processing environment 100 includes a plurality of wafer/die transport tools 115.

The wafer/die transport tool 115 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 115 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 115 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

FIG. 1B is a cross-sectional view of a plasma-based etch tool 108. The plasma-based etch tool 108 includes a type of dry etch tool that uses plasma ions to etch or remove portions of a semiconductor wafer or layers/structures formed thereon. In some implementations, the plasma-based etch tool 108 is a plasma etch tool for etching metals on a semiconductor wafer. In some implementations, the plasma-based etch tool 108 is a decoupled plasma source (DPS) tool, an inductively coupled plasma (ICP) tool, a transformer coupled plasma (TCP) tool, or another type of plasma etch tool.

As shown in FIG. 1B the plasma-based etch tool 108 includes a processing chamber 116. The processing chamber 116 includes a chamber that is capable of being hermitically sealed so that the processing chamber 116 can be pressurized (e.g., to a vacuum or a partial vacuum). In some implementations, the processing chamber 116 is sized to accommodate a particular size of wafer such as a 200 millimeter wafer. In some implementations, the processing chamber 116 is sized to accommodate various sizes of semiconductor wafers, such as a 150 millimeter semiconductor wafer, a 200 millimeter semiconductor wafer, a 300 millimeter wafer, and/or another sized semiconductor wafer. The plasma-based etch tool 108 includes a plasma supply system 118 that is configured to generate a plasma and provide or supply the plasma to the processing chamber 116.

A chuck 120 is included in the processing chamber 116. The chuck 120 is configured to support and secure a semiconductor wafer in the processing chamber 116. The chuck 120 includes an electrostatic chuck (e-chuck or ESC) or another type of chuck (e.g., a vacuum chuck) that is configured to hold and/or secure a semiconductor wafer in the processing chamber 116 during processing (e.g., plasma etching) of the semiconductor wafer. In implementations in which the chuck 120 includes an electrostatic chuck, the chuck 120 is configured to generate an electrostatic attracting force between the chuck 120 and the semiconductor wafer based on a voltage applied to the chuck 120. Moreover, a voltage may be provided to the chuck 120 from a power supply. The voltage may generate the electrostatic attracting force that secures the semiconductor wafer to the chuck 120.

The chuck 120 may be sized and shaped depending on a size and a shape of semiconductor wafer to be processed in the plasma-based etch tool 108. For example, the chuck 120 may be circular shaped and may support all or a portion of a circular shaped semiconductor wafer. In some implementations, the chuck 120 is constructed of a material or materials that are resistant to abrasion and/or corrosion caused by materials used to generate the plasma, and that can generate the attractive force between the chuck 120 and a semiconductor wafer. For example, the chuck 120 may be constructed of a metal, such as aluminum, stainless steel, or another suitable material.

A focus ring 122 is included in the processing chamber 116. The focus ring 122 (also referred to as an edge ring or a single ring) includes a ring-shaped structure that is positioned around a portion of the chuck 120. The focus ring 122 is configured to focus the plasma in the processing chamber 116 toward a semiconductor wafer on the chuck 120 by directing (or redirecting) at least a portion of the plasma toward the semiconductor wafer. In this way, the focus ring 122 may increase electrical and plasma fluid uniformity in the processing chamber 116. In some implementations, a voltage is applied to the focus ring 122 (e.g., from a power supply) so that the focus ring 122 provides the electrical and plasma uniformity. The focus ring 122 may be sized and shaped depending on a size and a shape of semiconductor wafer to be processed in the plasma-based etch tool 108. For example, the focus ring 122 may be circular shaped and may include an opening to enable the focus ring 122 to surround a semiconductor wafer on the chuck 120. In some implementations, the focus ring 122 is constructed of a material or materials that are resistant to abrasion and/or corrosion caused by materials used to generate the plasma, and that can provide the electrical and plasma uniformity for a semiconductor wafer. For example, the focus ring 122 may be constructed of a metal, such as aluminum, stainless steel, and/or another suitable material.

During a plasma operation of a semiconductor wafer in the plasma-based etch tool 108, a bias voltage may be applied to the chuck 120 such that an electric field is generated between the semiconductor wafer and the plasma in the processing chamber 116. The bias voltage may include a negative bias voltage, which results in an excess of positively charged ions in a layer of the plasma above the semiconductor wafer. This dense layer of positively charged ions is referred to as a sheath 124, which may also be referred to as a plasma sheath, an electrostatic sheath, or a Debye sheath. The bias voltage may be used to control the flow rate and direction of ions in the plasma processing chamber 116 to adjust the etching properties of the plasma.

The plasma supply system 118 may include a process gas source to provide a gas flow (e.g., argon or another type of gas flow) to the processing chamber 116. The plasma supply system 118 may provide the plasma and the gas flow to the processing chamber 116 through an inlet port 126 in a first side (e.g., a top side) of the processing chamber 116. The plasma and the gas flow are removed from the processing chamber 116 through an exhaust port 128 (or outlet port) at an opposing side (e.g., a bottom side) of the processing chamber 116. The plasma-based etch tool 108 includes a vacuum pump 130 to facilitate the generation of a flow path 132 of the plasma and the gas flow between the inlet port 126 and the exhaust port 128. For example, and as shown in the example in FIG. 1B, the flow path 132 originates at the inlet port 126, the flow path 132 expands outward in the processing chamber 116 and flows around the chuck 120 and the focus ring 122, and downward under the chuck 120 toward the exhaust port 128. The vacuum pump 130 may be further configured to control the pressure in the processing chamber 116 and to generate a vacuum (or partial vacuum) in the processing chamber 116.

As further shown in FIG. 1B, the plasma supply system 118 includes an inner plasma source 134 and an outer plasma source 136. The inner plasma source 134 and the outer plasma source 136 include independently controllable plasma sources that, in combination, are configured to control and shape the plasma in the processing chamber 116. For example, the power, voltage, and/or other parameters may be independently configurable for inner plasma source 134 and the outer plasma source 136 to provide a plasma to the processing chamber 116 such that the plasma includes a particular electric field distribution, a particular ion composition and/or distribution, and/or a particular ion bombardment direction or angle, among other examples such that the intensity of the plasma is greater in particular areas in the processing chamber 116 relative to other areas of the processing chamber 116.

The inner plasma source 134 and the outer plasma source 136 are respectively connected to radio frequency (RF) sources 138*a* and 138*b*. The RF source 138*a* and the RF source 138*b* may be referred to as a bias RF sources in that the RF source 138*a* and the RF source 138*b* are configured to provide or supply an RF or alternating current to the inner plasma source 134 and the outer plasma source 136, respectively, to bias the inner plasma source 134 and the outer plasma source 136. The inner plasma source 134 and/or the outer plasma source 136 may be biased to increase or decrease the strength of attraction of the ions in the plasma, which may be used to increase or decrease the etch rate (or etch rate distribution) for a semiconductor wafer. The RF source 138*a* and the RF source 138*b* may each be connected to an electrical ground and may each include RF power supply or another type of device that is capable of generating and providing/supplying an RF current in a suitable frequency range such as approximately 10 MHz to approximately 30 MHz or approximately 300 MHz to approximately 300 GHz, among other examples.

To generate the plasma, the RF sources 138*a* and 138*b* may provide RF or alternating current to the inner plasma source 134 and the outer plasma source 136, respectively. The RF or alternating current may traverse through and/or along the coiled conductors of the inner plasma source 134 and the outer plasma source 136, which generates a time-varying electromagnetic field through electromagnetic induction. The time-varying electromagnetic field may create an electromotive force, which energizes a gas flow into the processing chamber 116 with electrons, thereby forming the plasma.

The number and arrangement of devices shown in FIGS. 1A and 1B are provided as one or more examples. In practice, there may be additional devices, fewer devices, different devices, or differently arranged devices than those shown in FIGS. 1A and/or 1B. Furthermore, two or more devices shown in FIGS. 1A and/or 1B may be implemented within a single device, or a single device shown in FIGS. 1A and/or 1B may be implemented as multiple, distributed devices. Additionally, or alternatively, a set of devices (e.g., one or more devices) of environment 100 may perform one or more functions described as being performed by another set of devices of environment 100.

Figure 2:
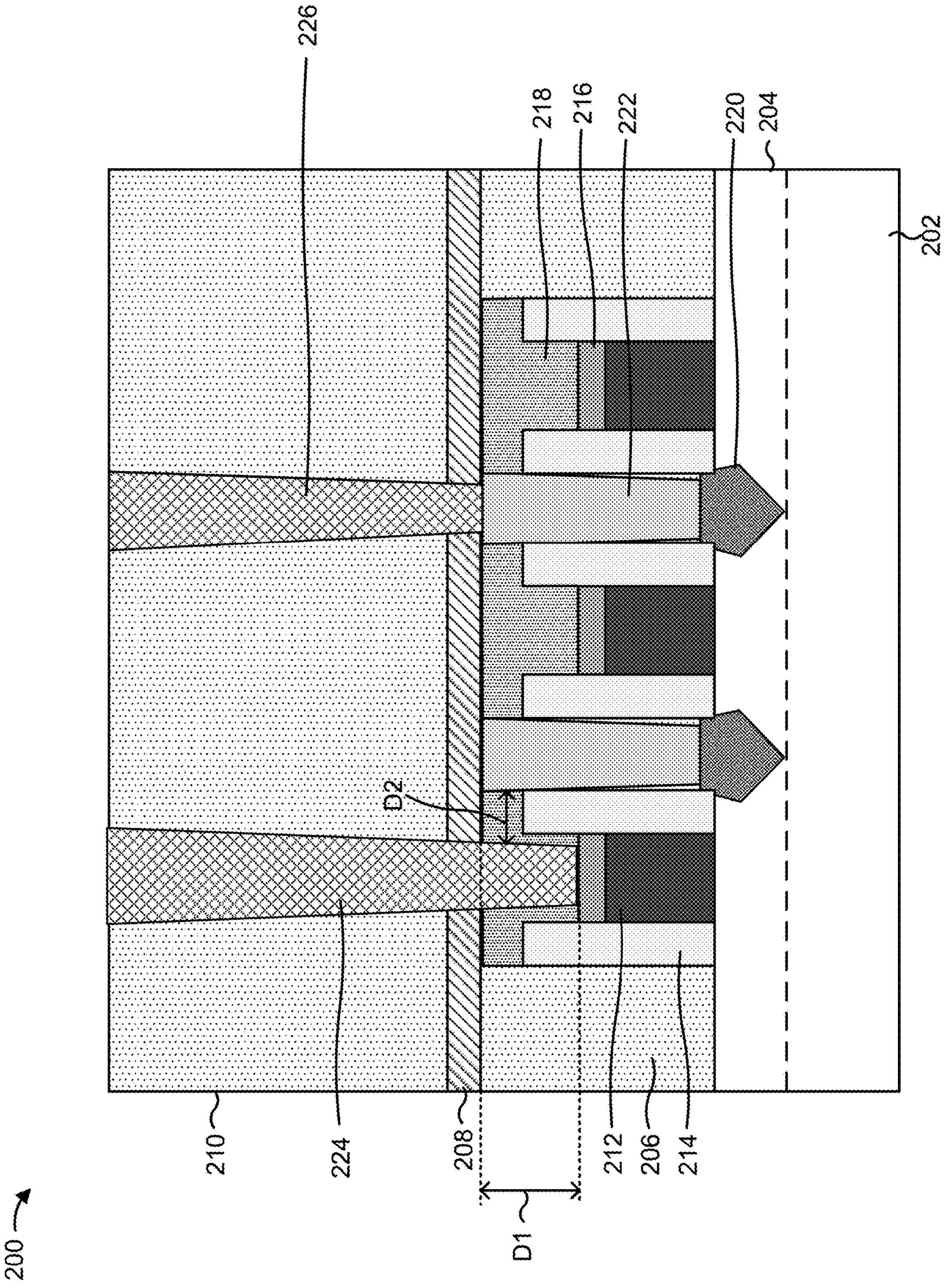
FIGS. 2-5 are diagrams of an example semiconductor structure described herein.

FIG. 2 is a diagram of a portion of a semiconductor device 200 described herein. The portion of the semiconductor device 200 includes an example of a memory device (e.g., a static random access memory (SRAM), a dynamic random access memory (DRAM)), a logic device, a processor, a ring oscillator (RO) device, an input/output (I/O) device, or another type of semiconductor device that includes one or more transistors.

As shown in FIG. 2, the semiconductor device 200 includes a device substrate 202, which includes a silicon (Si) substrate, a substrate formed of a material including silicon, a III-V compound semiconductor material substrate such as gallium arsenide (GaAs), a silicon on insulator (SOI) substrate, a silicon germanium (SiGe) substrate, or another type of semiconductor substrate. In some implementations, a fin structure 204 is formed in the device substrate 202. In some implementations, a plurality of fin structures 204 are included in the device substrate 202. In this way, the transistors included on the semiconductor device 200 include fin field-effect transistors (finFETs). In some implementations, the semiconductor device 200 includes other types of transistors, such as gate all around (GAA) transistors (e.g., nanosheet transistors, nanowire transistors, nanostructure transistors), planar transistors, and/or other types of transistors. The fin structures 204 are electrically isolated by intervening shallow trench isolation (STI) structures or regions (not shown). The STI structures may be etched back such that the height of the STI structures is less than the height of the fin structures 204. In this way, the gate structures of the transistors may be formed around at least three sides of the fin structures 204.

As shown in FIG. 2, a plurality of layers are included on the device substrate 202 and/or on the fin structures 204, including a dielectric layer 206, an etch stop layer (ESL) 208, and a dielectric layer 210, among other examples. The dielectric layers 206 and 210 are included to electrically isolate various structures of the semiconductor device 200. The dielectric layers 206 and 210 include interlayer dielectric layers (ILDs). For example, the dielectric layer 206 may include an ILD0 layer, and the dielectric layer 210 may include an ILD1 layer or an ILD2 layer (in some cases, the ILD1 layer is skipped).

The thickness of the dielectric layer 210 may be included in a range of approximately 3 nanometers to approximately 40 nanometers to provide sufficient height or depth for forming the interconnect structures of the semiconductor device 200 without unduly increasing the height of the semiconductor device 200. However, other values for the thickness of the dielectric layer 210 are within the scope of the present disclosure. The dielectric layers 206 and 210 each include (e.g., either the same material or different materials) a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), a zinc oxide ($Zn_xO_y$), and/or another dielectric material.

The thickness of the ESL 208 may be included in a range of approximately 3 nanometers to approximately 20 nanometers to provide sufficient etch selectivity without unduly increasing the height of the semiconductor device 200. However, other values for the thickness of the ESL 208 are within the scope of the present disclosure. The ESL 208 includes a layer of material that is configured to permit various portions of the semiconductor device 200 (or the layers included therein) to be selectively etched or protected from etching to form one or more of the structures included on the device substrate 202. The ESL 208 may include a lanthanum oxide ($La_xO_y$), an aluminum oxide ($Al_xO_y$) a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

As further shown in FIG. 2, a plurality of gate stacks may be included over, on, and/or around a portion of the fin structure 204. The gate stacks include a metal gate (MG) structure 212 between sidewall spacers 214, a metal capping layer 216 over and/or on the metal gate structure 212, and a dielectric capping layer 218 over and/or on the metal capping layer 216. The metal gate structures 212 include a conductive metallic material (or metal alloy) such as cobalt (Co), tungsten (W), ruthenium (Ru), molybdenum (Mo), titanium (Ti), titanium nitride (TiN), another metallic material, and/or a combination thereof. The sidewall spacers 214 are included to electrically isolate the gate stacks from adjacent conductive structures included on the semiconductor device 200, and thus may be referred to as gate spacers. The sidewall spacers 214 include a silicon oxide ($SiO_x$), a silicon nitride ($Si_xN_y$), a silicon oxy carbide (SiOC), a silicon oxycarbonitride (SiOCN), and/or another suitable material.

The metal capping layer 216 is included to protect the metal gate structure 212 from oxidization and/or etch damage during processing of the semiconductor device 200, which preserves the low contact resistance of the metal gate structure 212. The metal capping layer 216 include a conductive metallic material (or metal alloy) such as cobalt (Co), tungsten (W) (e.g., fluorine free tungsten (FFW)), ruthenium (Ru), molybdenum (Mo), titanium (Ti), titanium nitride (TiN), another metallic material, and/or a combination thereof. The dielectric capping layer 218 includes a dielectric material such as a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

The dielectric capping layer 218 may be referred to as a sacrificial (SAC) layer that protects the gate stacks from processing damage during processing of the semiconductor device 200. In some implementations, the dielectric capping layer 218 includes a first portion (e.g., a lower portion) between a pair of sidewall spacers 214, where the first portion extends from a top surface of an associated metal capping layer 216 to the same approximately height or top surface level of the sidewall spacers 214. In these implementations, the dielectric capping layer 218 further includes a second portion (e.g., an upper portion) that extends above the first portion and over the top surfaces of the sidewall spacers 214, as shown in FIG. 2. In some other implementations, the sidewall spacers 214 fully extend between the fin structure 204 (or the device substrate 202) and the ESL 208, and the dielectric capping layer 218 is fully contained between the sidewall spacers 214 between the top surface of the associated metal capping layer 216 and the bottom surface of the ESL 208.

As further shown in FIG. 2, a plurality of source/drain regions 220 are included on and/or around portions of the fin structure 204. The source/drain regions 220 include p-doped and/or n-doped epitaxial (epi) regions that are grown and/or otherwise formed by epitaxial growth. In some implementations, the source/drain regions 220 are formed over etched portions of the fin structure 204. The etched portions may be formed by strained source drain (SSD) etching of the fin structure 204 and/or another type etching operation.

Metal source/drain contacts (MDs) 222 are included over and/or on the source/drain regions 220. In some implementations, a metal silicide layer (not shown) is included between the source/drain regions 220 and the metal source/drain contacts 222 due to a reaction between the source/drain regions 220 and the metal source/drain contacts 222. The metal silicide layer may be included to decrease contact resistance between the source/drain regions 220 and the metal source/drain contacts 222 and/or to decrease the Schottky barrier height (SBH) between the source/drain regions 220 and the metal source/drain contacts 222. The metal source/drain contacts 222 include conductive metallic material (or metal alloy) such as cobalt (Co), tungsten (W), ruthenium (Ru), copper (Cu), another metallic material, and/or a combination thereof.

In some implementations, a contact etch stop layer (CESL) is included between the sidewall spacers of the gate stacks and the metal source/drain contacts 222. The CESL may be included to provide etch selectivity or etch stop point for the sidewall spacers 214 during an etch operation to form openings in which the metal source/drain contacts 222 are formed.

As further shown in FIG. 2, the metal gate structures 212 (e.g., either directly or via the metal capping layer 216) and the metal source/drain contacts 222 are electrically and/or physically connected to interconnect structures. For example, a metal gate structure 212 may be electrically connected to a gate interconnect structure 224 (e.g., a gate via, via-to-gate, or VG). The metal gate structure 212 is electrically and/or physically connected to the gate interconnect structure 224 directly, via the intervening metal capping layer 216, and/or by a metal gate contact (MP). As another example, a metal source/drain contact 222 may be electrically and/or physically connected to a source/drain interconnect structure 226 (e.g., a source/drain via, via-to-source/drain, or VD).

The interconnect structures (e.g., the gate interconnect structure 224, the source/drain interconnect structure 226, among other examples) electrically connect the transistors on the semiconductor device 200 and/or electrically connect the transistors to other areas and/or components of the semiconductor device 200. In some implementations, the interconnect structures electrically connect the transistors to a back end of line (BEOL) region of the semiconductor device 200. The gate interconnect structure 224 and the source/drain interconnect structure 226 include a conductive material such as tungsten, cobalt, ruthenium, copper, and/or another type of conductive material. The gate interconnect structure 224 includes a conductive material such as tungsten (W), ruthenium (Ru), molybdenum (Mo), cobalt (Co), copper (Cu), titanium (Ti), aluminum (Al), another conductive material, a conductive material composition, or a combination thereof. The source/drain interconnect structure 226 includes a conductive material such as tungsten (W), ruthenium (Ru), molybdenum (Mo), cobalt (Co), copper (Cu), titanium (Ti), aluminum (Al), another conductive material, a conductive material composition, or a combination thereof.

As described herein, the gate interconnect structure 224 may be formed using a dry-wet-dry processing flow that includes a multi-step (e.g., two-step) etch technique for forming an opening in which the gate interconnect structure 224 is formed. The multi-step etch technique may include performing one or more first etch operations to etch the dielectric layer 210 (and in some cases, the ESL 208) to form the opening to a first depth, and performing a second etch operation to form the opening to a second depth corresponding to a top surface of a metal capping layer 216 over a metal gate structure 212. A wet cleaning operation may be performed between the one or more first etch operations and the second etch operation to facilitate removal of residual materials and/or native materials from the opening to increase the performance of the gate interconnect structure 224 and to reduce defect formation in the semiconductor device 200. In some implementations, a dry ashing operation is performed in the same processing chamber 116 of the etch tool 108 as the one or more first etch operations (e.g., as opposed to performing the dry ashing operation and the one or more first etch operations in separate processing chambers 116), which decreases the exposure of the semiconductor device 200 to environmental conditions that might otherwise increase exposure to oxidation and other types of contamination.

As further shown in FIG. 2, the semiconductor device 200 may include one or more dimensions. An example dimension may include a distance (D1) between a bottom surface of the gate interconnect structure 224 and a top surface of a metal source/drain contact 222. In some implementations, the distance (D1) may be included in a range of greater than 0 nanometers to approximately 10 nanometers for a processing node (e.g., an N5 processing node) to facilitate crystal formation for the metal source/drain contact 222. In some implementations, the distance (D1) may be included in a range of approximately 10 nanometers to approximately 35 nanometers for a processing node (e.g., an N3 processing node) to reduce a likelihood of leakage between the metal source/drain contact 222 and the gate interconnect structure 224, and to facilitate landing of the metal source/drain contact 222 on an associated source/drain region 220. However, other values for the range are within the scope of the present disclosure.

Another example dimension may include a distance (D2) between a sidewall of a gate interconnect structure 224 and an adjacent sidewall of a metal source/drain contact 222. In some implementations, the distance (D2) may be included in a range of approximately 20 nanometers to approximately 60 nanometers for a processing node (e.g., an N5 processing node) to reduce a likelihood of leakage between the metal source/drain contact 222 and the gate interconnect structure 224 while enabling increased device density for the semiconductor device 200. In some implementations, the distance (D2) may be included in a range of approximately 5 nanometers to approximately 20 nanometers for a processing node (e.g., an N3 processing node) to reduce a likelihood of leakage between the metal source/drain contact 222 and the gate interconnect structure 224 while enabling further increased device density for the semiconductor device 200. However, other values for the range are within the scope of the present disclosure.

In some implementations, a ratio between the distance D2 to the distance D1 is included in a range of approximately 2:1 to approximately 60:1. In some implementations, a ratio between the distance D2 to the distance D1 is included in a range of approximately 1:7 to approximately 2:1.

As indicated above, FIG. 2 is provided as an example. Other examples may differ from what is described with regard to FIG. 2.

Figure 3:
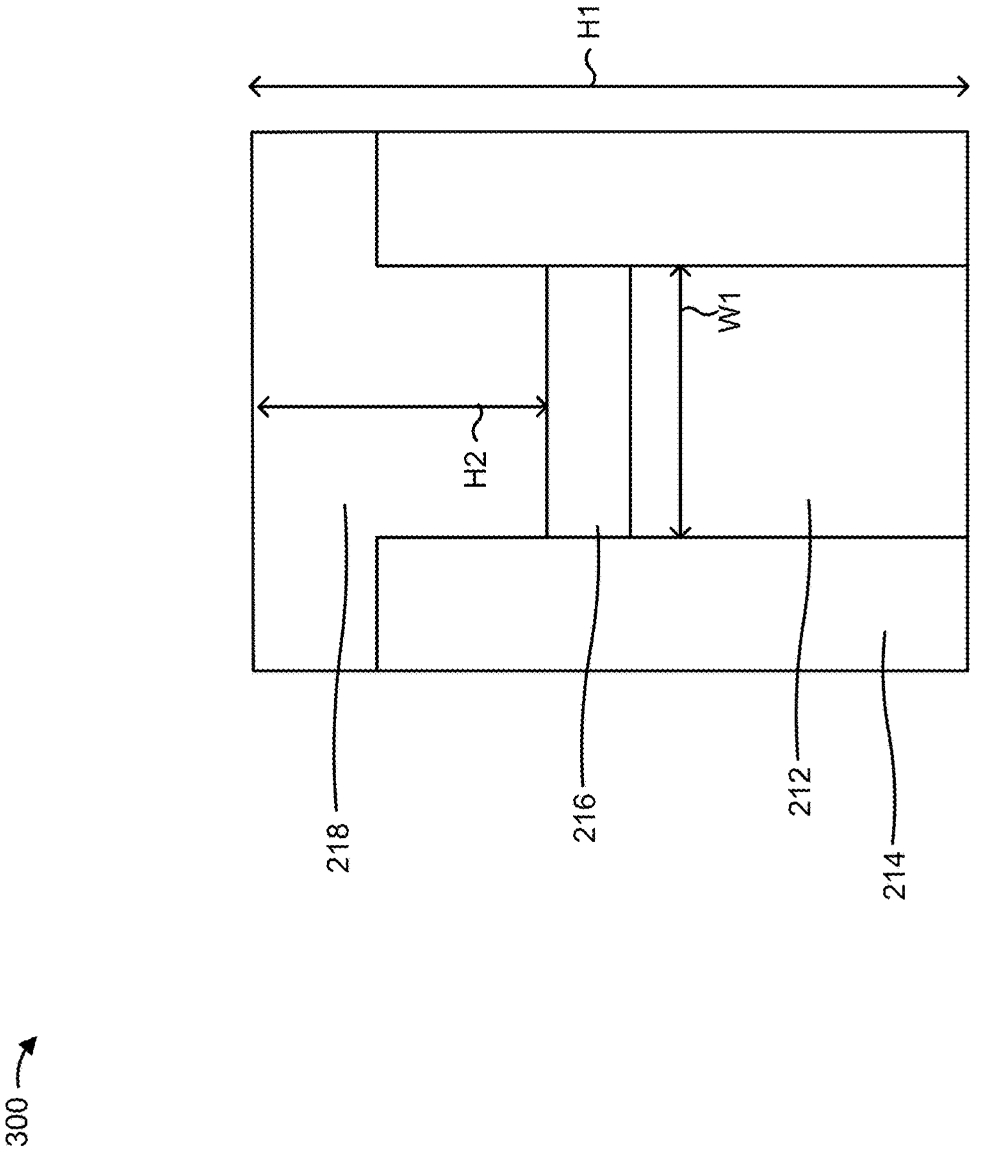

FIG. 3 is a diagram of an example implementation 300 of semiconductor structures described herein. The example implementation 300 includes various dimensions and/or parameters of a metal gate structure 212, of a plurality of sidewall spacers 214, of a metal capping layer 216, and of a dielectric capping layer 218 included in the semiconductor device 200.

As shown in FIG. 3, an example dimension includes a width (W1) of the metal gate structure 212. The width (W1) of the metal gate structure 212 may correspond to a bottom critical dimension of the metal capping layer 216. In some implementations, the width (W1) of the metal gate structure 212 is included in a range of approximately 10 nanometers to approximately 20 nanometers to provide sufficient transistor channel control while enabling transistors to be densely integrated into the semiconductor device 200. The bottom critical dimension of the metal capping layer 216 corresponding to the width (W1) may be included in this range to provide sufficient material for landing of a gate interconnect structure 224 onto the metal capping layer 216 while reducing a likelihood of under etching for the gate interconnect structure 224. However, other values for the width (W1) and the corresponding bottom critical dimension are within the scope of the present disclosure.

As further shown in FIG. 3, an example dimension includes a gate height (H1). The gate height (H1) may include a combination of the height of the metal gate structure 212, the thickness or height of the metal capping layer 216, and the thickness or height of the dielectric capping layer 218. In some implementations, the gate height (H1) is included in a range of approximately 53 nanometers to approximately 60 nanometers to reduce a likelihood of leakage between the metal gate structure 212 and an adjacent metal source/drain contact 222. However, other values for the gate height (H1) are within the scope of the present disclosure.

As further shown in FIG. 3, an example dimension includes a height (H2) or thickness of the dielectric capping layer 218. In some implementations, the height (H2) is included in a range of approximately 30 nanometers to approximately 40 nanometers to reduce a likelihood of over etching for an associated gate interconnect structure 224, to reduce a likelihood of under etching for the gate interconnect structure 224, and/or to reduce a likelihood of damage to an adjacent metal source/drain contact 222. However, other values for the height (H2) are within the scope of the present disclosure.

As indicated above, FIG. 3 is provided as an example. Other examples may differ from what is described with regard to FIG. 3.

Figure 4:
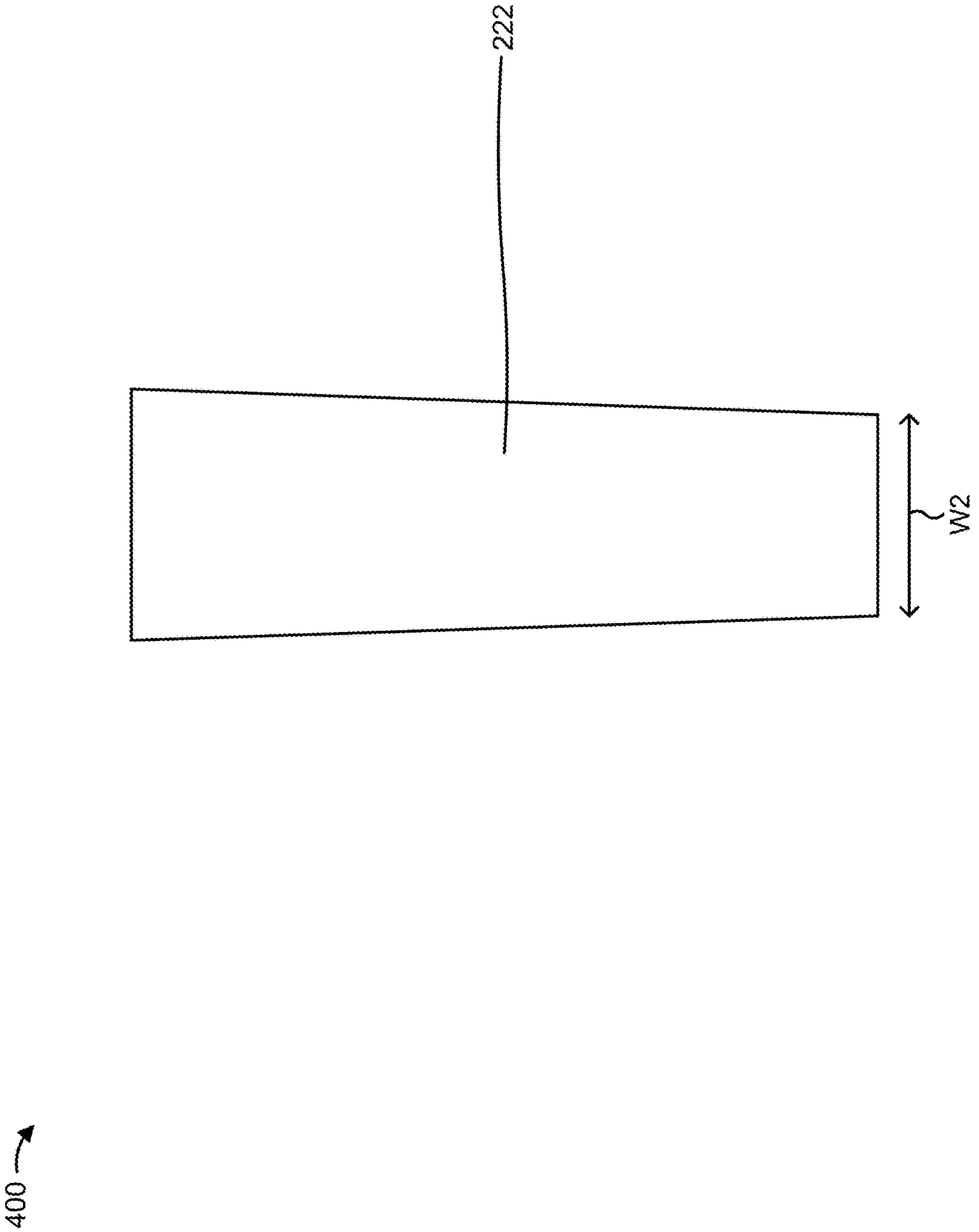

FIG. 4 is a diagram of an example implementation 400 of a semiconductor structure described herein. The example implementation 400 includes various dimensions and/or parameters of a metal source/drain contact 222 included in the semiconductor device 200.

As shown in FIG. 4, an example dimension includes a width (W2) of the metal source/drain contact 222. In particular, the width (W2) may correspond to a bottom width or bottom critical dimension of the metal source/drain contact 222 (e.g., a width of a bottom of the metal source/drain contact 222). In some implementations, the width (W2) of the metal source/drain contact 222 is included in a range of approximately 5 nanometers to approximately 15 nanometers to enable increased device density for the semiconductor device 200 while reducing a likelihood of under etching of the metal source/drain contact 222 and/or the source/drain interconnect structure 226. However, other values for the width (W2) of the metal source/drain contact 222 are within the scope of the present disclosure.

In some implementations, a ratio of the width (W1) to the width (W2) is in a range of approximately 1:1.5 to approximately 4:1. In some implementations, a ratio of the gate height (H1) to the width (W2) is included in a range of approximately 3.5:1 to approximately 12:1.

As indicated above, FIG. 4 is provided as an example. Other examples may differ from what is described with regard to FIG. 4.

Figure 5:
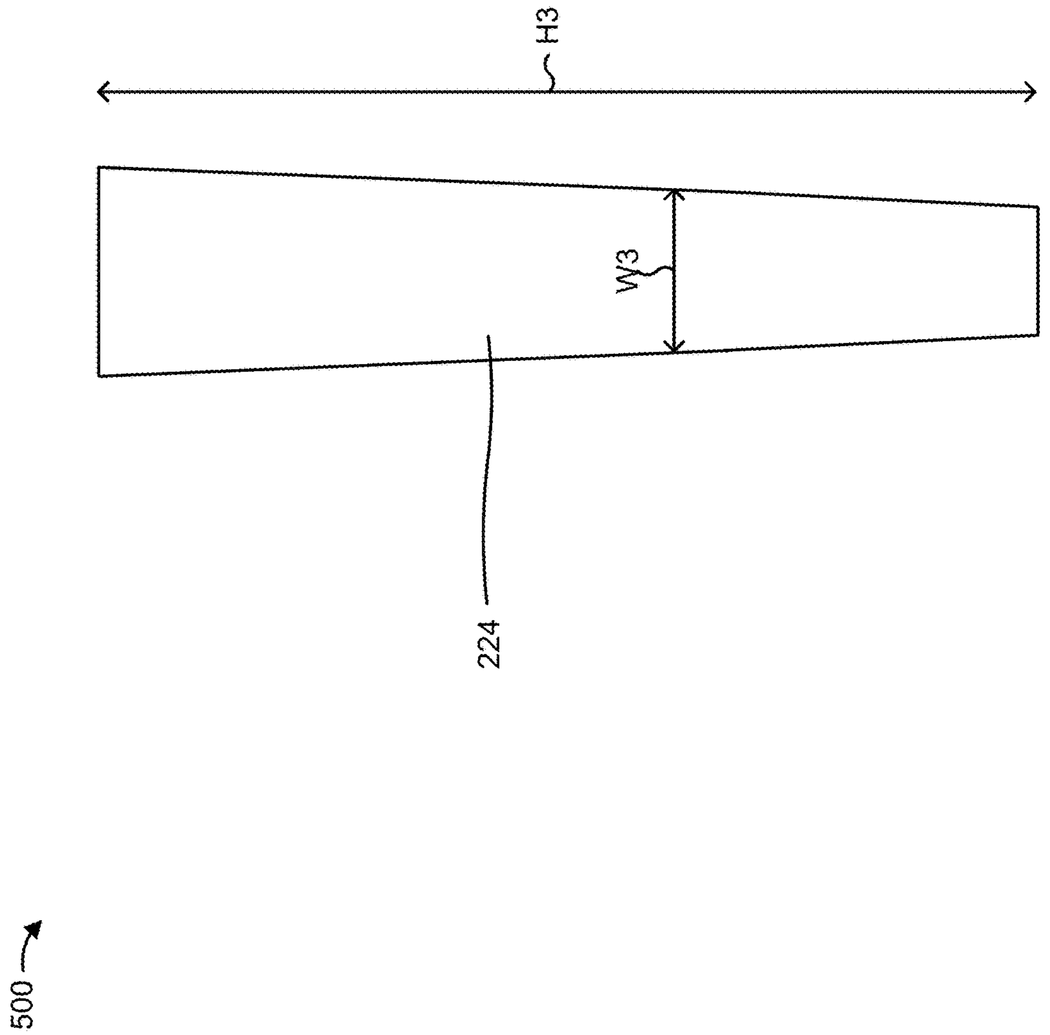

FIG. 5 is a diagram of an example implementation 500 of a semiconductor structure described herein. The example implementation 500 includes various dimensions and/or parameters of a gate interconnect structure 224 included in the semiconductor device 200.

As shown in FIG. 5, an example dimension includes a height (H3) of the gate interconnect structure 224. In some implementations, the height (H3) is included in a range of approximately 30 nanometers to approximately 60 nanometers for a particular processing node (e.g., an N5 processing node) to enable increased gap filling performance for filling an opening with a conductive material to form the gate interconnect structure 224 while reducing leakage for the gate interconnect structure 224. In some implementations, the height (H3) is included in a range of approximately 20 nanometers to approximately 50 nanometers for a particular processing node (e.g., an N3 processing node) to enable increased device density for the semiconductor device 200, to enable increased gap filling performance for filling an opening with a conductive material to form the gate interconnect structure 224, and/or to reduce leakage for the gate interconnect structure 224. However, other values for the height (H3) are within the scope of the present disclosure.

As shown in FIG. 5, an example dimension includes a width (W3) of the gate interconnect structure 224. The width (W3) may correspond to a middle critical dimension (e.g., a T50 critical dimension) of the gate interconnect structure 224. In some implementations, the width (W3) is included in a range of approximately 10 nanometers to approximately 20 nanometers for a particular processing node (e.g., an N5 processing node) to enable increased device density for the semiconductor device 200 while reducing a likelihood of under etching for the gate interconnect structure 224. In some implementations, the width (W3) is included in a range of approximately 5 nanometers to approximately 15 nanometers for a particular processing node (e.g., an N3 processing node) to enable further increased device density for the semiconductor device 200 while reducing resistance and reducing a likelihood of leakage for the gate interconnect structure 224. However, other values for the width (W3) are within the scope of the present disclosure.

As indicated above, FIG. 5 is provided as an example. Other examples may differ from what is described with regard to FIG. 5.

FIGS. 6A-6G are diagrams of an example implementation 600 described herein. The example implementation 600 includes an example of forming the gate interconnect structure 224 and the source/drain interconnect structure 226 illustrated in FIG. 2 and/or elsewhere herein. Moreover, the example implementation 600 includes an example of performing a dry-wet-dry process flow that includes a two-step etch technique to form an opening in which the gate interconnect structure 224 is to be formed. This increases the ability to remove residual materials and/or native oxides from the opening prior to formation of the gate interconnect structure 224, which reduces contact resistance for the gate interconnect structure 224, reduces a likelihood of peeling and/or delamination of the gate interconnect structure 224, and/or reduces a likelihood of under etching of other structures in the semiconductor device, among other examples.

Figure 6A:
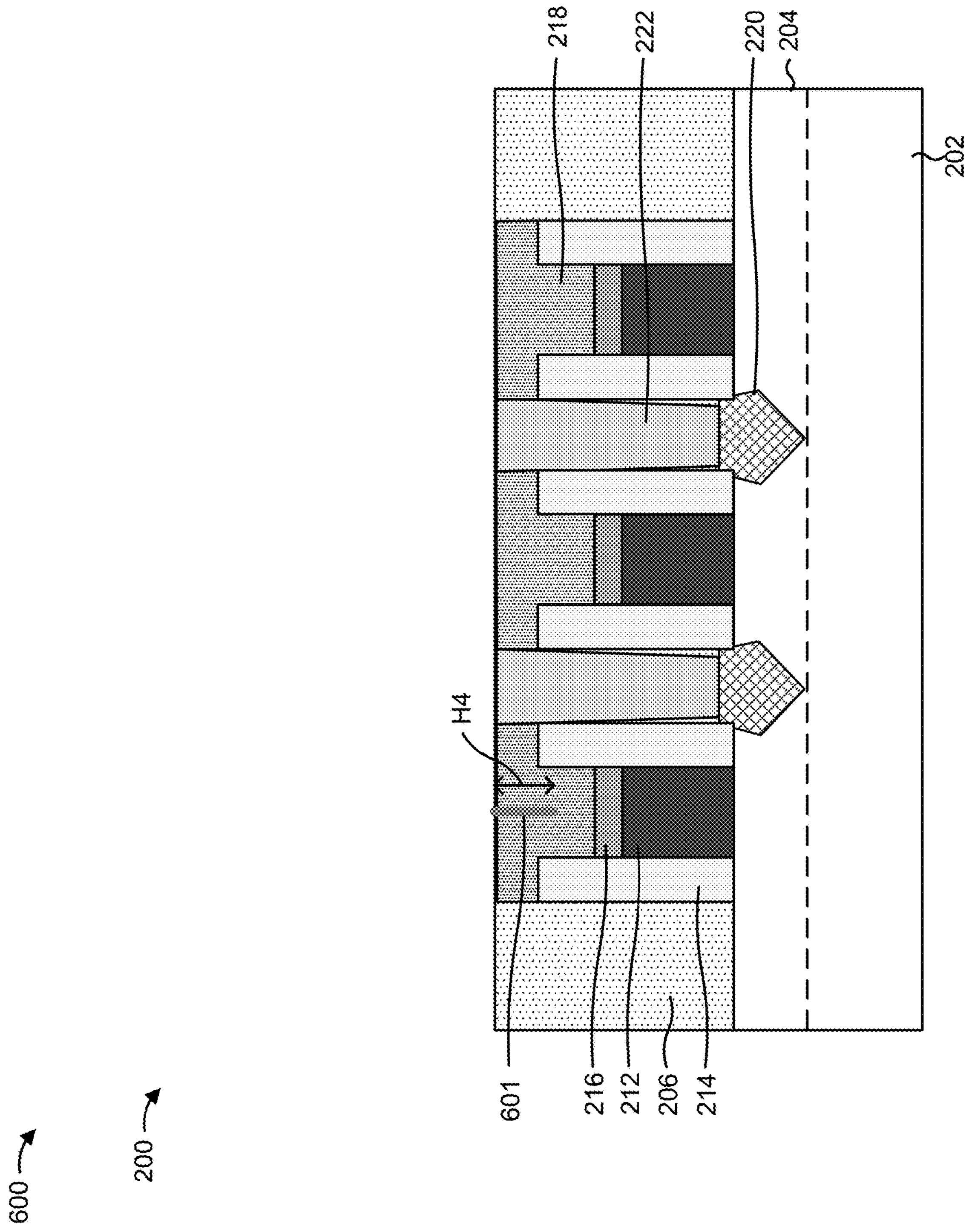
FIGS. 6A-6G, 7A-7G, and 8A-8L are diagrams of example implementations described herein.

Turning to FIG. 6A, one or more operations may be performed to form the fin structure 204, the metal gate structures 212, the metal capping layers 216, the dielectric capping layers 218, the dielectric layer 206, the source/drain regions 220, and/or the metal source/drain contacts 222. As further shown in FIG. 6A, in some cases, a seam 601 may result (e.g., as a defect) in one or more of the dielectric capping layers 218. In some cases, the seam 601 may be filled with a residual material from one or more other process flows, such as titanium (Ti) and/or titanium nitride (TiN) from a process in which the metal source/drain contacts 222 are formed. The seam 601 may include a height (H4) that is included in a range of approximately 20 nm to approximately 30 nm. The height (H4) may be approximately 60% to approximately 80% of the height (H2) of the dielectric capping layer 218. However, other values for these ranges are within the scope of the present disclosure. As described herein, the wet cleaning operation that is performed between the etch operations of the dry-wet-dry process flow described herein enables removal of these residual materials from the seam(s) 601 in the dielectric capping layer(s) 218. Removal of the residual materials increases the effectiveness of the second etch of the two-step etch technique to fully etch through the dielectric capping layer(s) 218 and to the top surface of the associated metal capping layer(s) 216.

Figure 6B:
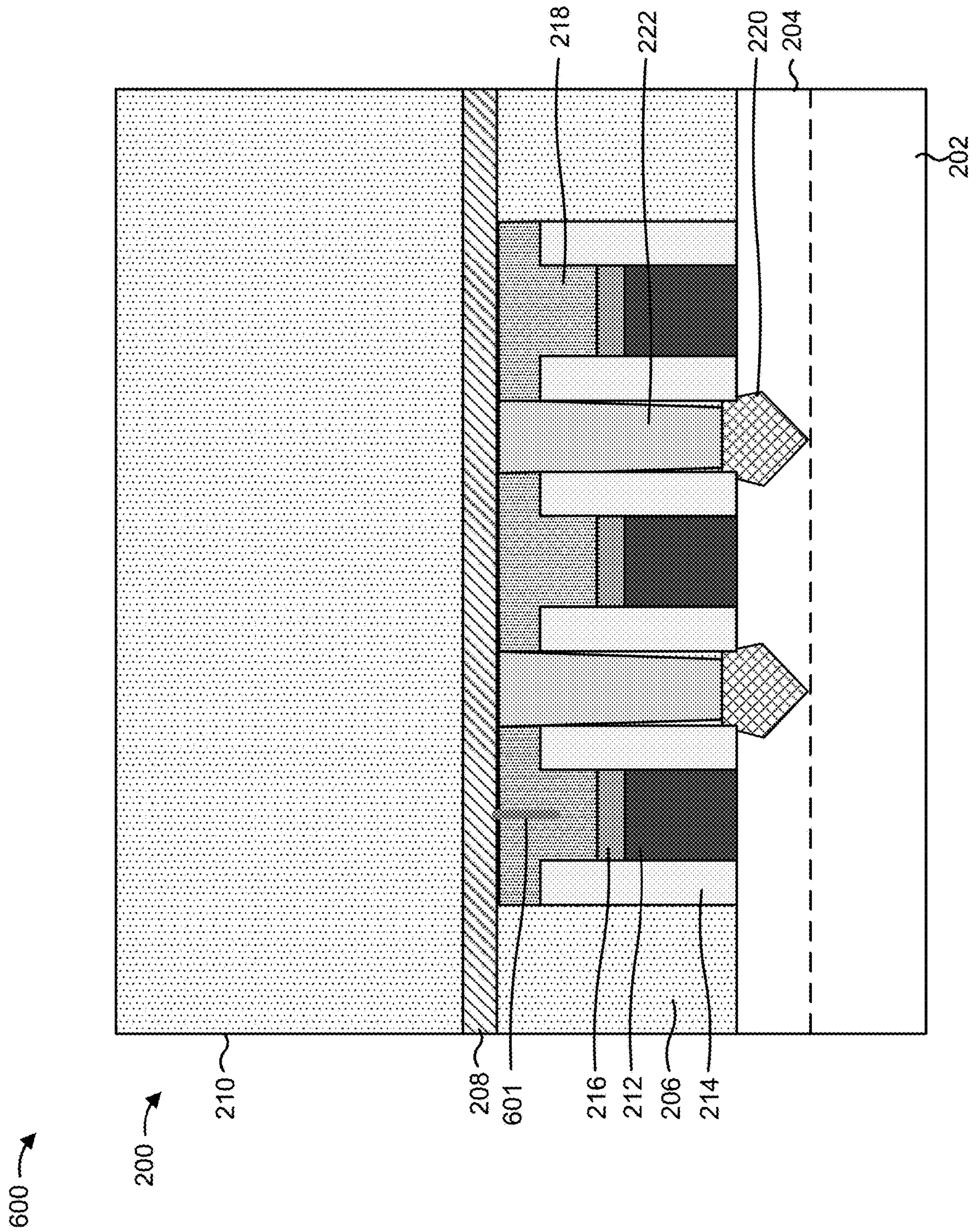

As shown in FIG. 6B, the ESL 208 is formed on the semiconductor device 200, and the dielectric layer 210 is formed over and/or on the ESL 208. In some implementations, a deposition tool 102 deposits the ESL 208 and the dielectric layer 210 using a CVD, ALD, PVD, and/or another deposition technique. An example dimension for the ESL 208 includes a thickness. In some implementations, the ESL 208 is formed to a thickness that is included in a range of approximately 10 nanometers to approximately 20 nanometers to provide sufficient etch stop performance, to achieve a particular thickness or height for the gate interconnect structure 224 and/or a particular thickness or height for the source/drain interconnect structure 226, and/or to achieve one or more other parameters. However, other values for the thickness of the ESL 208 are within the scope of the present disclosure. An example dimension for the dielectric layer 210 includes a thickness. In some implementations, the dielectric layer 210 is formed to a thickness that is included in a range of approximately 40 nanometers to approximately 60 nanometers to provide interlayer isolation, to achieve a particular thickness or height for the gate interconnect structure 224 and/or a particular thickness or height for the source/drain interconnect structure 226, and/or to achieve one or more other parameters. However, other values for the thickness of the dielectric layer 210 are within the scope of the present disclosure.

Figure 6C:
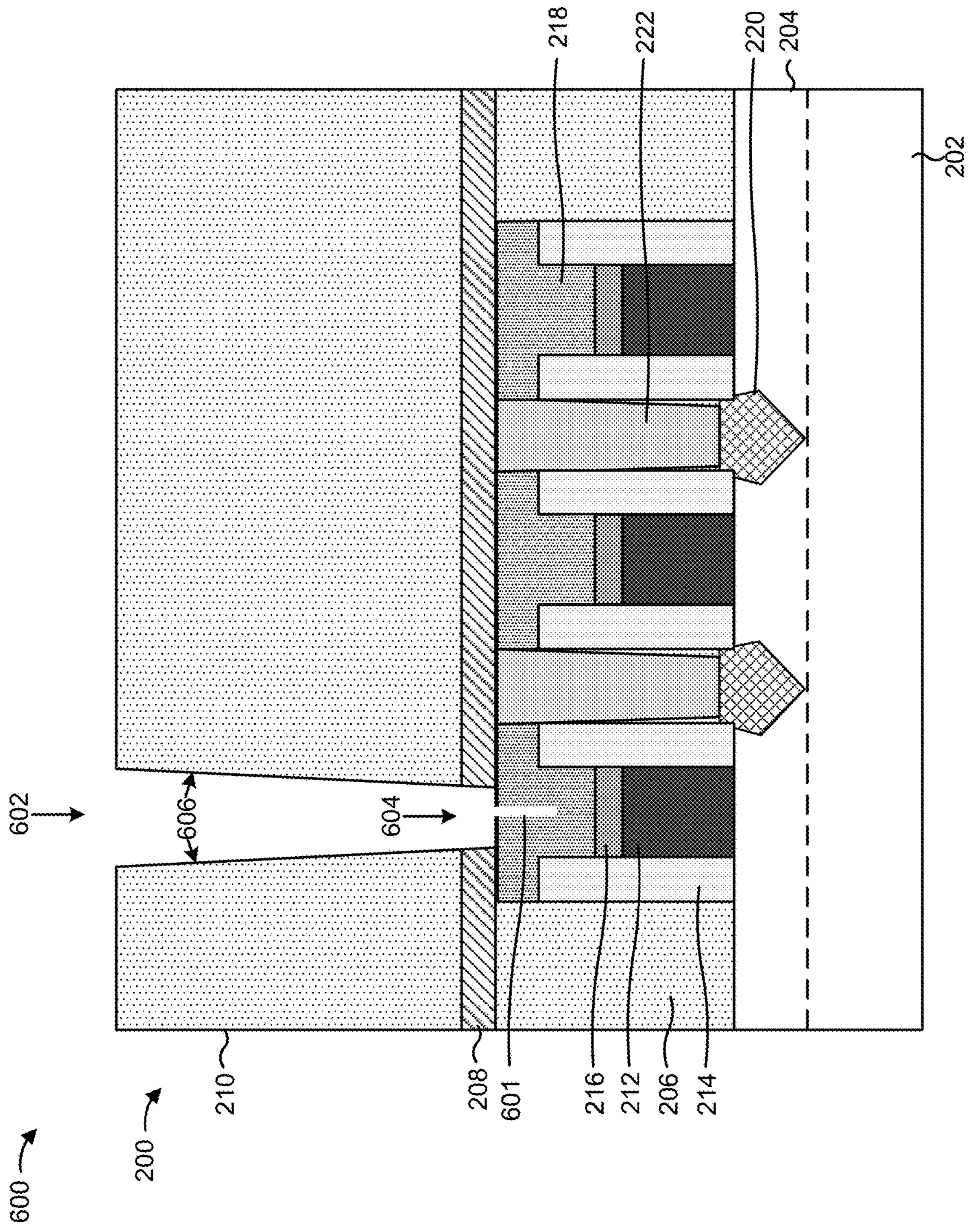

As shown in FIG. 6C, an opening (or a recess) 602 is formed in the dielectric layer 210. The opening 602 includes a bottom 604 and a plurality of sidewalls 606. The opening 602 may be formed to a first depth in one or more first etch operations as part of the two-step etch technique. In some implementations, the etch tool 108 performs the one or more first etch operations to form the opening 602 to a first depth.

At the first depth, the bottom 604 may correspond to a top surface of the ESL 208 (e.g., the one or more first etch operations stop on the ESL 208). Alternatively, and as shown in the example in FIG. 6C, the etch tool 108 may perform the one or more first etch operations to form the opening 602 through the ESL 208 to a first depth such that the bottom 604 corresponds to a top surface of a dielectric capping layer 218.

The one or more first etch operations may include one or more first dry etch operations (e.g., etch operations that are performed using dry chemicals or gasses as opposed to wet chemicals). In some implementations, the one or more first etch operations may include the use of a plasma (e.g., a plasma-based dry etch). In some implementations, a pattern in one or more patterning layers is used to etch the dielectric layer 210, the ESL 208, and/or the dielectric capping layer 218 to form the opening 602. In these implementations, the deposition tool 102 forms the one or more patterning layers on the dielectric layer 210. The exposure tool 104 exposes the one or more patterning layers to a radiation source to pattern the photoresist layer. The developer tool 106 develops and removes portions of the one or more patterning layers to expose the pattern. The etch tool 108 etches the dielectric layer 210, the ESL 208, and/or to the dielectric capping layer 218 based on the pattern to form the opening 602.

As indicated above, the etch tool 108 may perform the one or more first etch operations to form the opening 602 to the first depth such that the bottom 604 corresponds to a top surface of the dielectric capping layer 218. In this way, the seam 601 in the dielectric capping layer 218 is exposed through the opening 602. This enables the wet cleaning tool 114 to perform a wet cleaning operation (e.g., after the one or more first etch operations) to remove residual materials and/or native oxides from the seam 601 and/or generally from the opening 602 that might otherwise increase a likelihood of under etching of the opening 602. This increases the effectiveness of a second etch operation to extend the bottom 604 to the top surface of the metal capping layer 216.

The wet cleaning operation may be performed in a processing chamber of the wet cleaning tool 114. The wet cleaning tool 114 may perform the wet cleaning operation using a wet chemical to remove the residual materials and/or native oxides from the seam 601 and/or generally from the opening 602. The wet chemical may include hydrochloric acid (HCl) and/or another type of wet chemical that is suitable for removing the residual materials and/or native oxides from the seam 601 and/or generally from the opening 602.

Figure 6D:
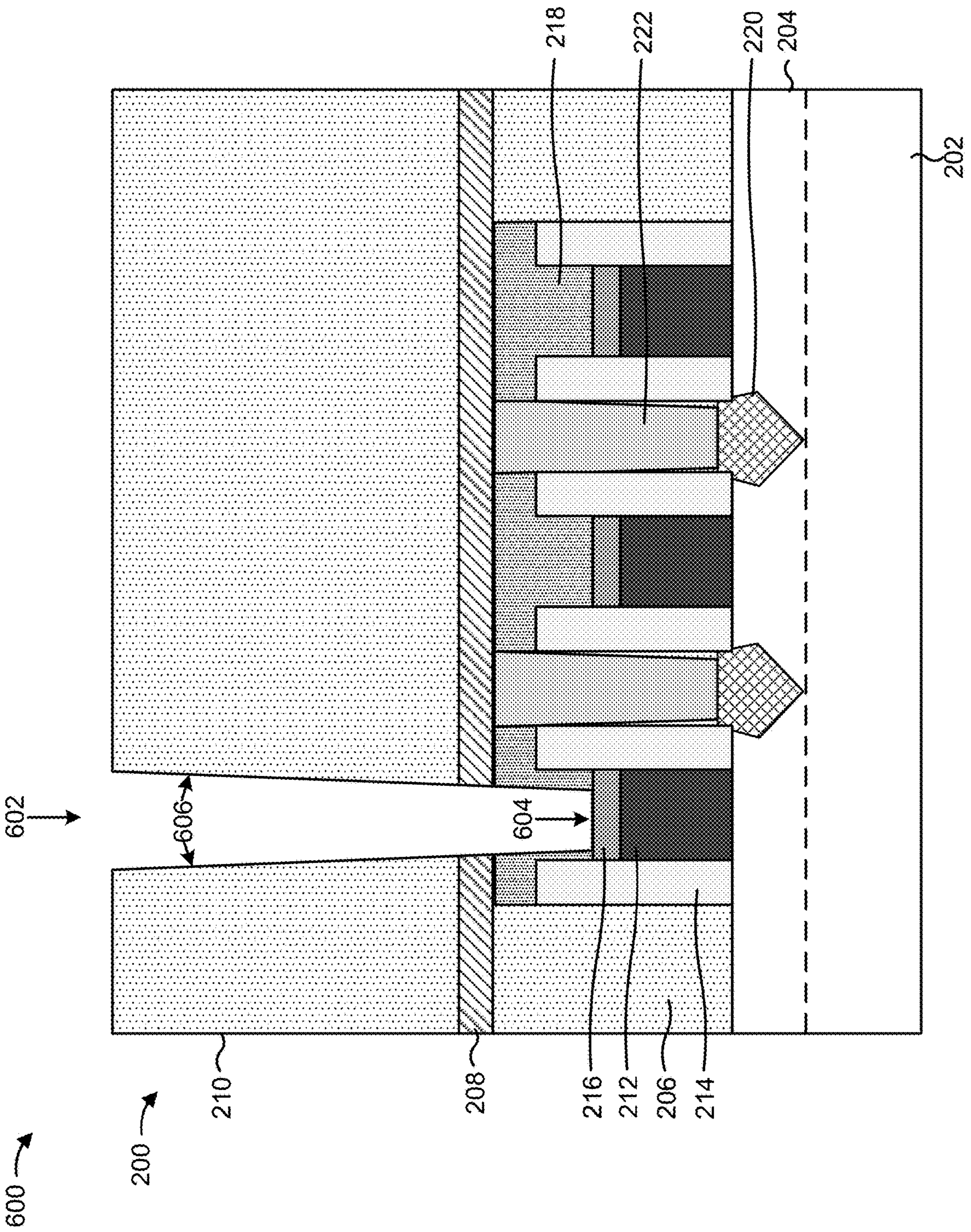

As shown FIG. 6D, the etch tool 108 performs a second etch operation after the one or more first etch operations (and after the wet cleaning operation) to increase the depth of the opening 602 such that the bottom 604 of the opening 602 is extended to a top surface of the metal capping layer 216. Thus, the top surface of the metal capping layer 216 is exposed through the opening 602 after the second etch operation.

Figure 6E:
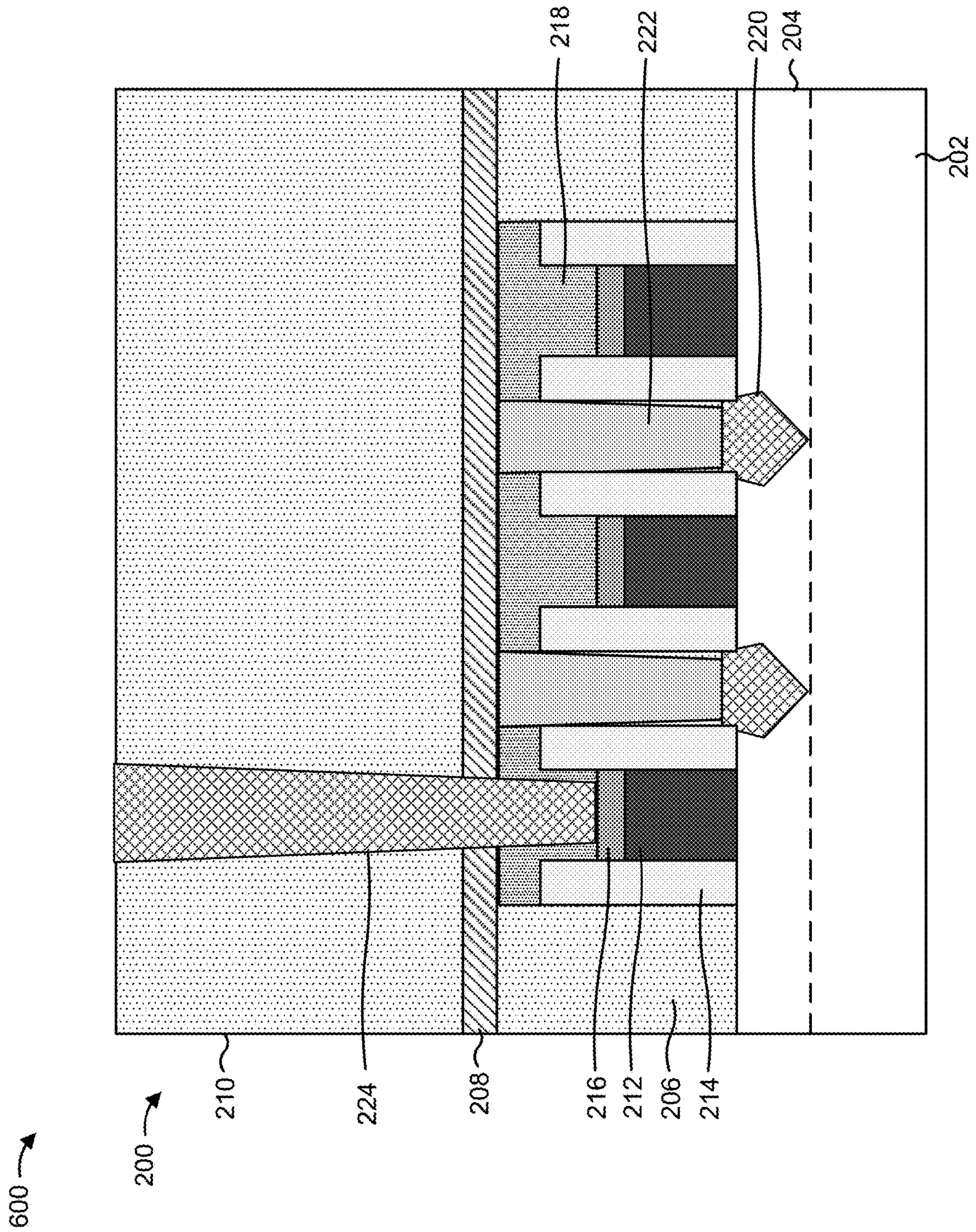

As shown in FIG. 6E, the opening 602 is filled with a conductive material (or a conductive material composition) to form the gate interconnect structure 224 after the second etch operation. In particular, the conductive material is deposited over the conductive structure (e.g., the metal capping layer 216 or the metal gate structure 212) in the opening 602. In some implementations, the deposition tool 102 performs a PVD operation, a CVD operation, or another type of deposition operation to form the gate interconnect structure 224 in the opening 602. In some implementations, the plating tool 112 performs a plating operation such as an electroplating operation to form the gate interconnect structure 224 in the first portion of the opening 602. In some implementations, the deposition tool 102 performs a deposition operation to deposit a seed layer in the opening 602 to promote adhesion of the sidewalls 606 and the deposition tool 102 performs another deposition operation (or the plating tool 112 performs a plating operation) to fill in the remaining portion of the gate interconnect structure 224 over the seed layer. In some implementations, one or more barrier layers, liners, and/or other conformal layers may be deposited in the opening 602 prior to formation of the gate interconnect structure 224 to promote adhesion, reduce contact resistance, and/or reduce copper migration, among other examples.

Figure 6F:
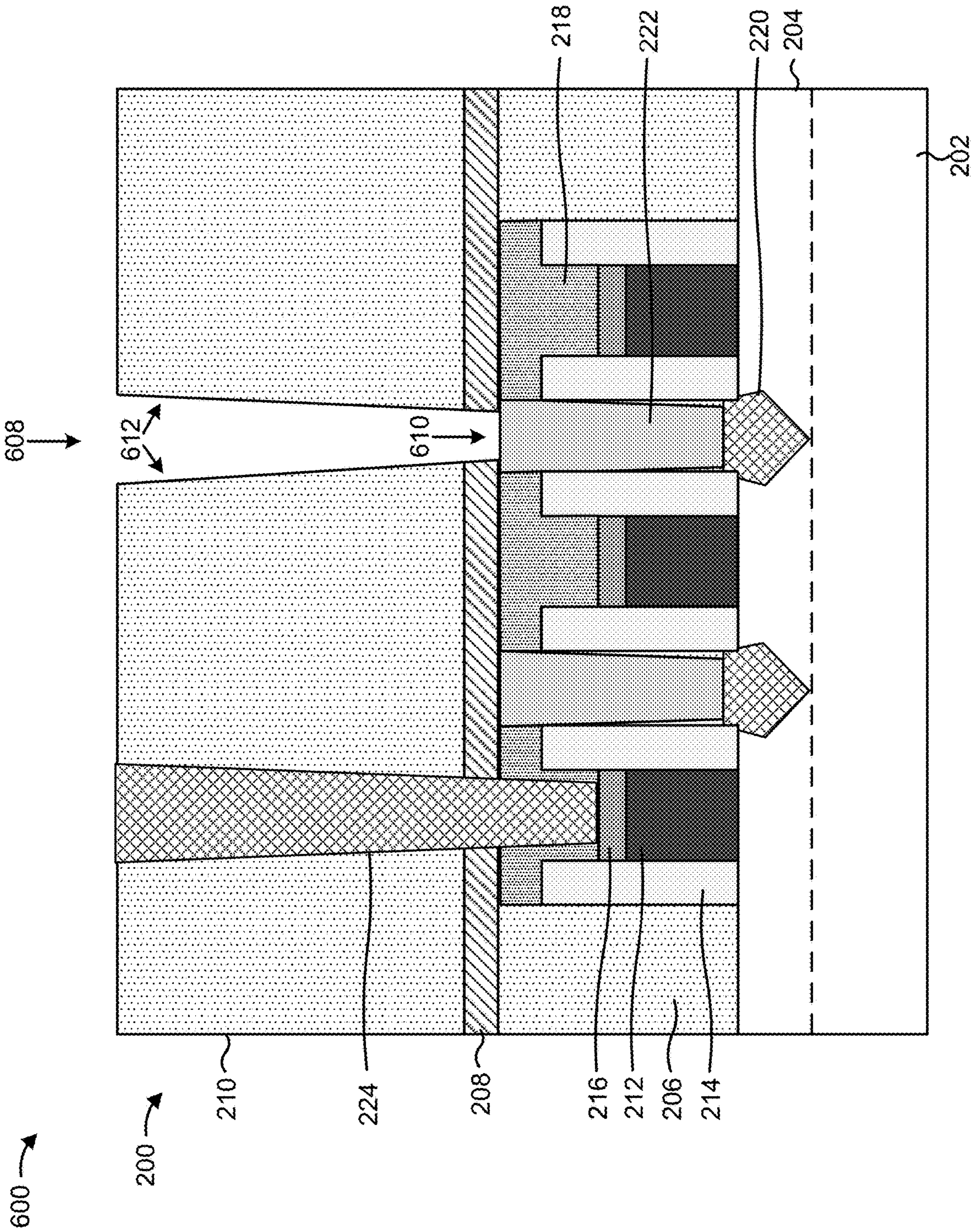

As shown in FIG. 6F, another opening (or another recess) 608 is formed in the dielectric layer 210 and in the ESL 208. In particular, the opening 608 is formed in and through the dielectric layer 210, in and through the ESL 208, and to a conductive layer (e.g., a metal layer, a metal contact) such as a metal source/drain contact 222. As shown in FIG. 6F, the opening 608 includes a bottom surface 610 (which corresponds to the top surface of the metal source/drain contact 222) and sidewalls 612 (which correspond to the ESL 208 and the dielectric layer 210).

In some implementations, a pattern in a photoresist layer is used to etch the dielectric layer 210 and the ESL 208 to form the opening 608. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches the dielectric layer 210 and the ESL 208 based on the pattern to form the opening 608. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for etching the opening 608 based on a pattern.

Figure 6G:
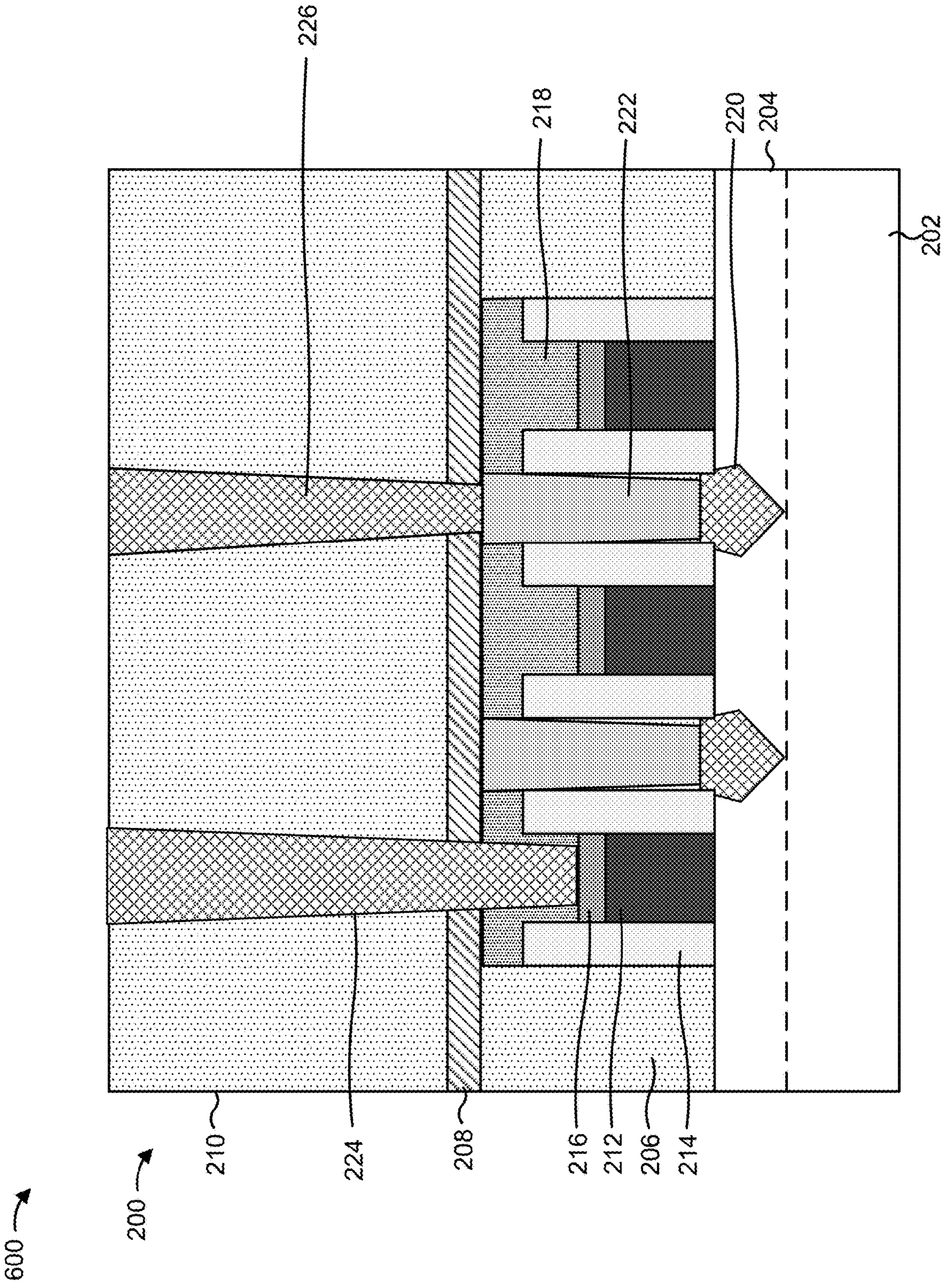

As shown in FIG. 6G, the opening 608 is filled with a conductive material (or a conductive material composition) to form a source/drain interconnect structure 226 in the opening 608. In particular, the conductive material is deposited over the metal source/drain contact 222 in the opening 608. In some implementations, the deposition tool 102 performs a PVD operation, a CVD operation, or another type of deposition operation to form the source/drain interconnect structure 226 in the opening 608. In some implementations, the plating tool 112 performs a plating operation such as an electroplating operation to form the source/drain interconnect structure 226 in the first portion of the opening 608. In some implementations, the deposition tool 102 performs a deposition operation to deposit a seed layer in the opening 608 to promote adhesion of the sidewalls 612 and the deposition tool 102 performs another deposition operation (or the plating tool 112 performs a plating operation) to fill in the remaining portion of the source/drain interconnect structure 226 over the seed layer. In some implementations, one or more barrier layers, liners, and/or other conformal layers may be deposited in the opening 608 prior to formation of the source/drain interconnect structure 226 to promote adhesion, reduce contact resistance, and/or reduce copper migration, among other examples.

As indicated above, FIGS. 6A-6G are provided as one or more examples. Other examples may differ from what is described with regard to FIGS. 6A-6G.

FIGS. 7A-7G are diagrams of an example implementation 700 described herein. The example implementation 700 includes an example of forming the gate interconnect structure 224 illustrated in FIG. 2 and/or elsewhere herein. Moreover, the example implementation 700 includes an example of performing a dry-wet-dry process flow that includes a two-step etch technique to form an opening in which the gate interconnect structure 224 is to be formed. In some implementations, one or more operations and/or techniques described in connection with FIGS. 7A-7G may be performed as part of the example implementation 600 of FIGS. 6A-6G. In some implementations, one or more operations and/or techniques described in connection with FIGS. 7A-7G may be performed as an alternative to one or more operations and/or techniques of the example implementation 600 of FIGS. 6A-6G.

Figure 7A:
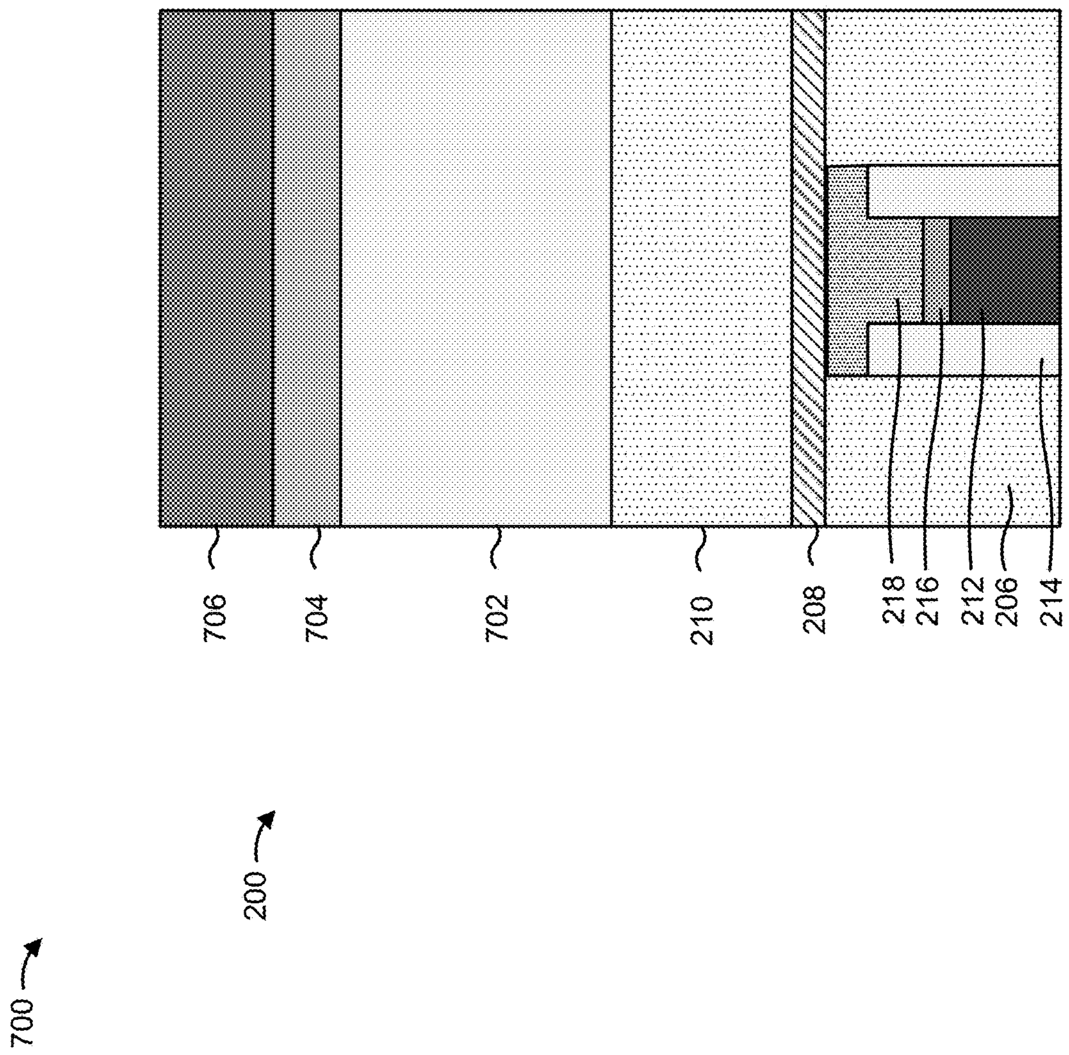

As shown in FIG. 7A, the deposition tool 102 may form a plurality of patterning layers over and/or on the dielectric layer 210. The plurality of patterning layers may include a bottom hard mask layer (BL) 702 over and/or on the dielectric layer 210, a middle hard mask layer (ML) 704 over and/or on the bottom hard mask layer 702, and a photoresist layer (PR) 706 over and/or on the middle hard mask layer 704. The deposition tool 102 performs a PVD operation, a CVD operation, or another type of deposition operation to form the plurality of patterning layers.

One or more of the semiconductor processing tools may form a pattern in the plurality of patterning layers. The pattern may be used (e.g., by the etch tool 108) to form an opening to the metal capping layer 216 (or to the metal gate structure 212) in which the gate interconnect structure 224 is to be formed. For example, the exposure tool 104 may expose the photoresist layer 706 to a radiation source to pattern the photoresist layer 706. The developer tool 106 develops and removes portions of the photoresist layer 706 to expose the pattern. The etch tool 108 may etch the middle hard mask layer 704 and the bottom hard mask layer 702 to extend the pattern through the middle hard mask layer 704 and the bottom hard mask layer 702 and to the top surface of the dielectric layer 210.

Figure 7B:
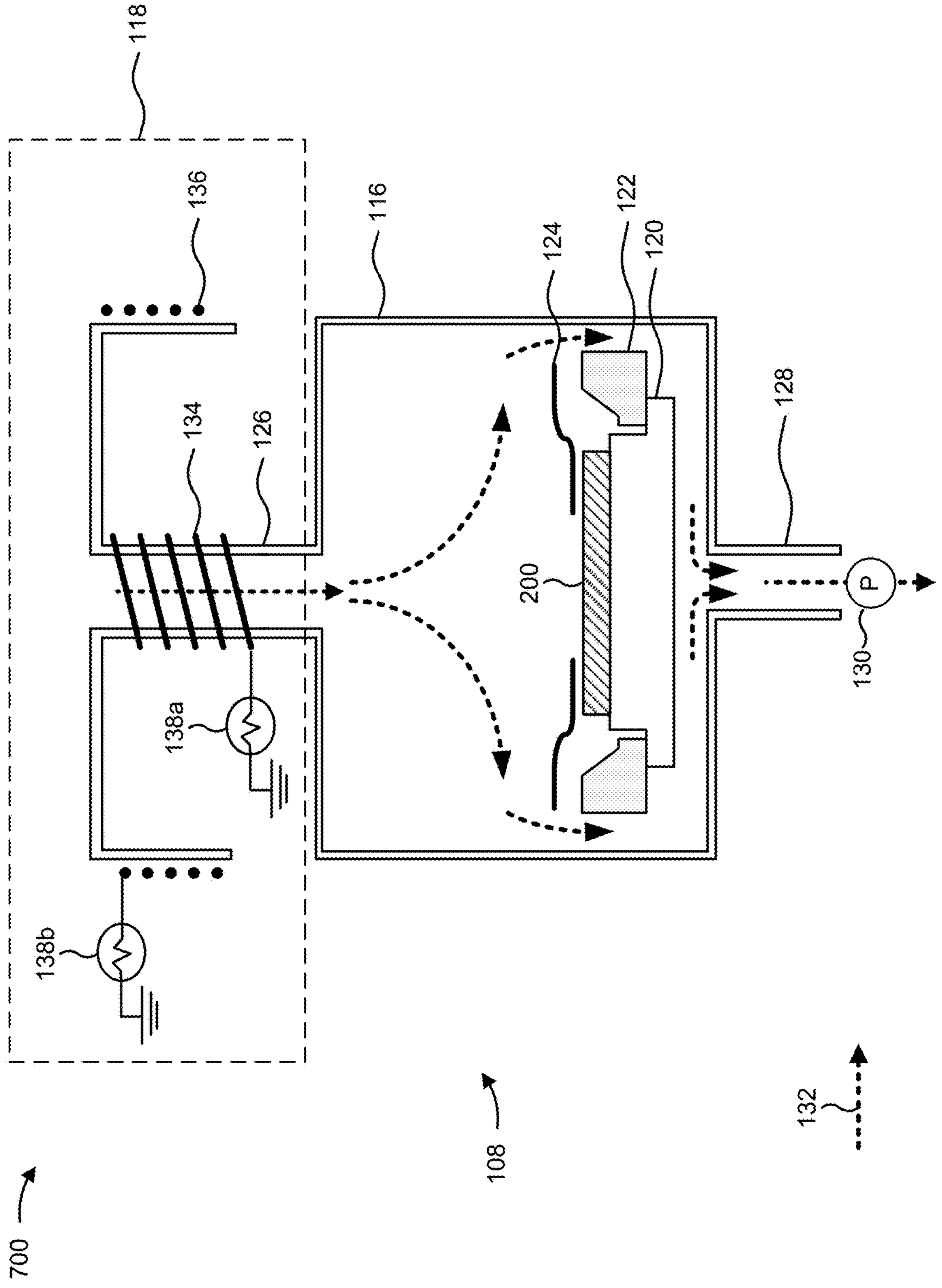
Figure 7C:
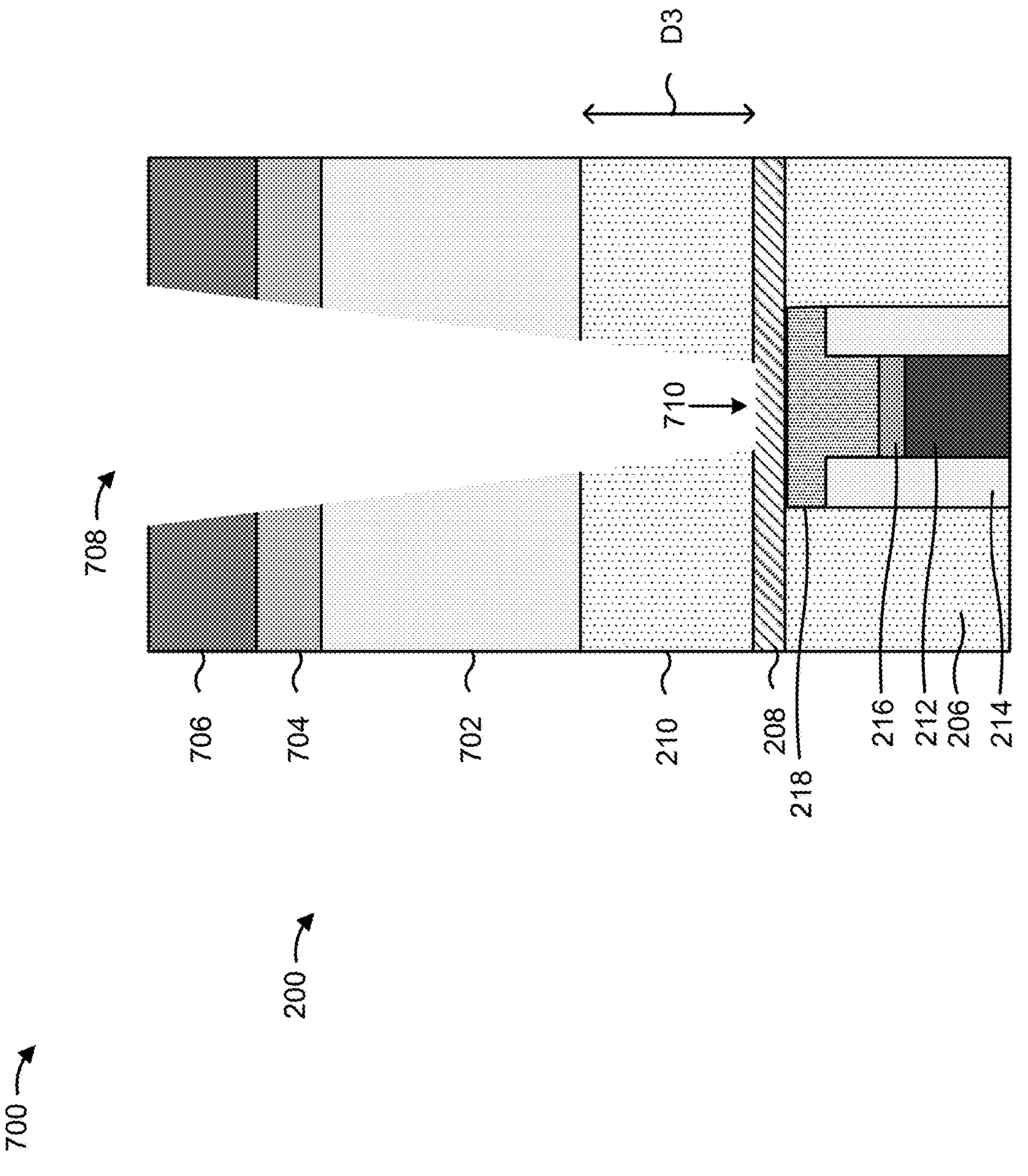

As shown in FIGS. 7B and 7C, the semiconductor device 200 may be positioned in the processing chamber 116 of the etch tool 108 (e.g., after formation of the pattern in the plurality of patterning layers). The etch tool 108 may perform a first etch operation to form an opening 708 through the dielectric layer 210 such that a bottom 710 of the opening corresponds to the top surface of the ESL 208, in the example illustrated in FIGS. 7B and 7C. Alternatively, the etch tool 108 may perform the first etch operation to form the opening 708 such that the bottom 710 of the opening is formed into a portion of the ESL 208 or to a top surface of the dielectric capping layer 218. The first etch operation may include a dry etch operation such as a plasma-based etch operation that includes the use of a plasma (e.g., a plasma-based dry etch).

Figure 7D:
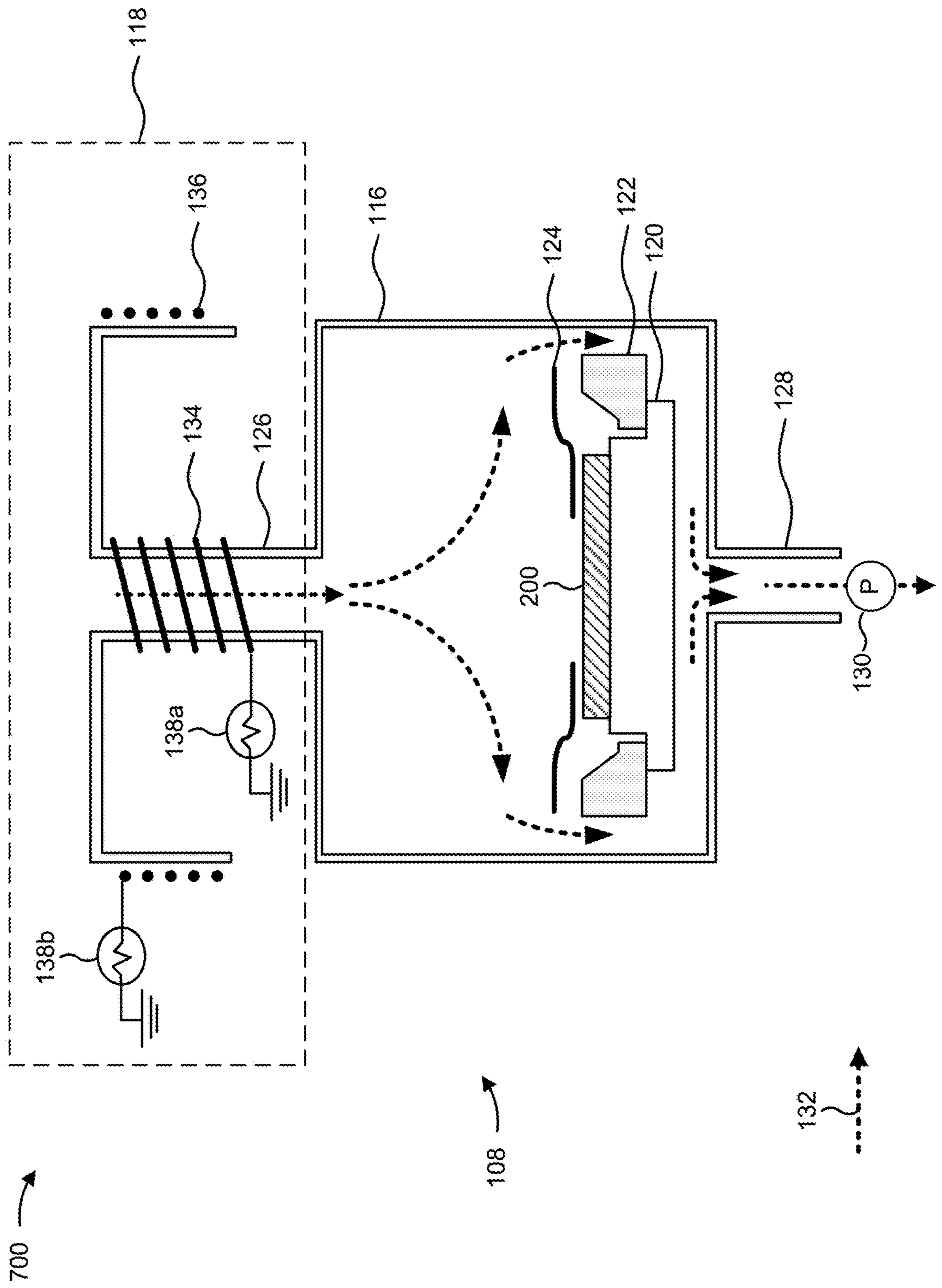
Figure 7E:
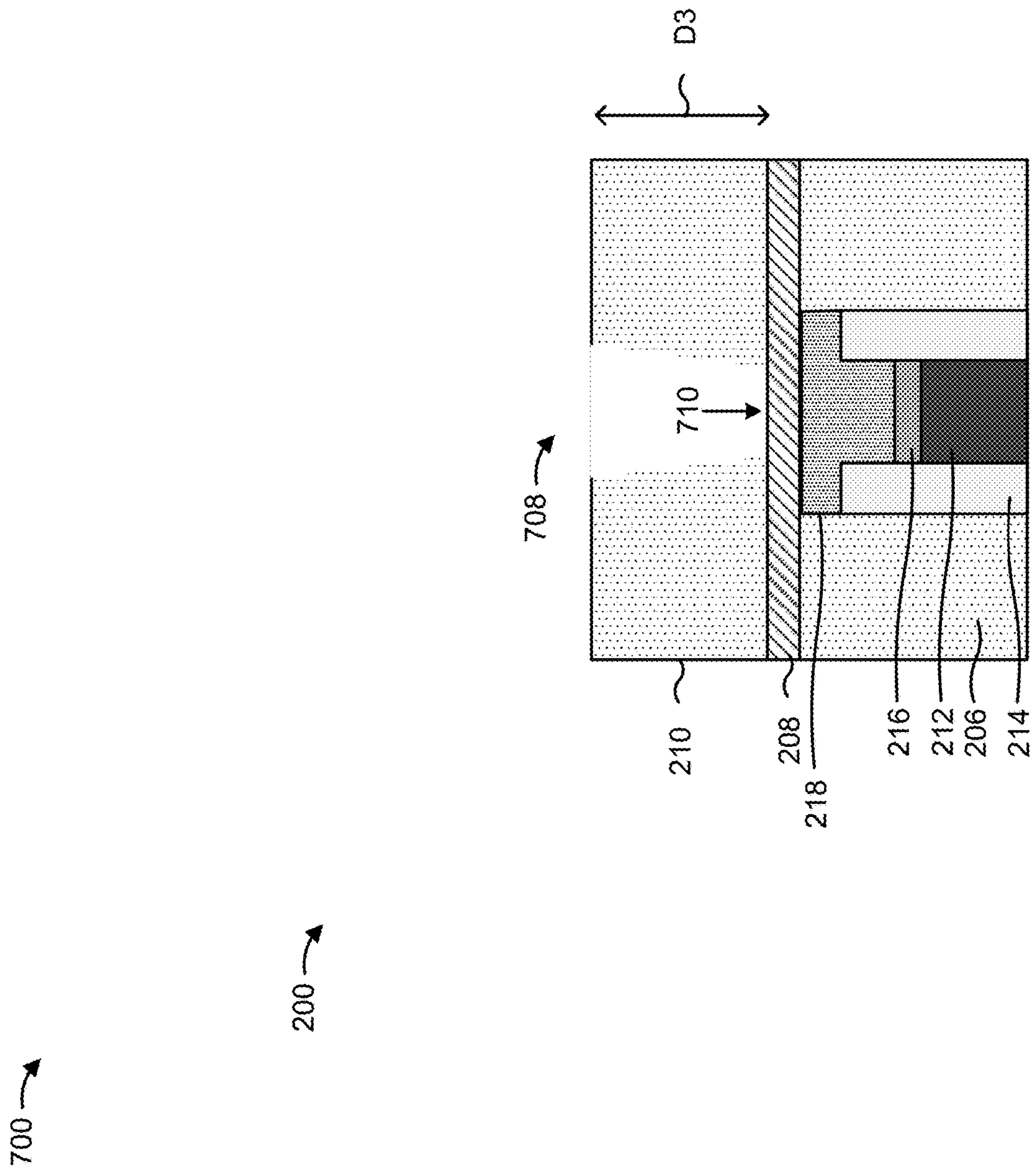

As shown in FIGS. 7D and 7E, the etch tool 108 may perform a dry ashing operation to remove the remaining portions of the plurality of patterning layers (e.g., using a plasma ashing technique) after the first etch operation. In particular, the etch tool 108 performs the dry ashing operation in the same processing chamber 116 as the first etch operation is performed. Thus, the semiconductor device 200 remains in the same processing chamber 116 for the first etch operation and the dry ashing operation so that the first etch operation and the dry ashing operation are performed "in-situ" (e.g., without breaking the vacuum in the processing chamber 116). This reduces the exposure of semiconductor device 200 to environmental conditions outside of the processing chamber 116, which might otherwise increase a likelihood of contamination or oxidation of the semiconductor device 200. Moreover, performing the first etch operation and the dry ashing operation in the same processing chamber 116 reduces processing and/or queue times for the semiconductor device 200, as there is less transfer time between processing chambers and less waiting for another processing chamber to become available for the dry ashing operation relative to performing the dry ashing operation in another processing chamber. As shown in FIG. 7E, the etch tool 108 forms the opening 708 to a first depth (D3) in the first etch operation.

The wet cleaning tool 114 may perform a first wet cleaning operation (e.g., after the one or more first etch operations and after the dry ashing operation) to remove residual materials and/or native oxides from the opening 708 that might otherwise increase a likelihood of under etching of the opening 708. This increases the effectiveness of a second etch operation to extend the bottom 710 to the top surface of the metal capping layer 216. The first wet cleaning operation may be performed in a processing chamber of the wet cleaning tool 114. The wet cleaning tool 114 may perform the first wet cleaning operation using a wet chemical to remove the residual materials and/or native oxides from the opening 708. The wet chemical may include hydrochloric acid (HCl) and/or another type of wet chemical that is suitable for removing the residual materials and/or native oxides from the opening 708.

Figure 7F:
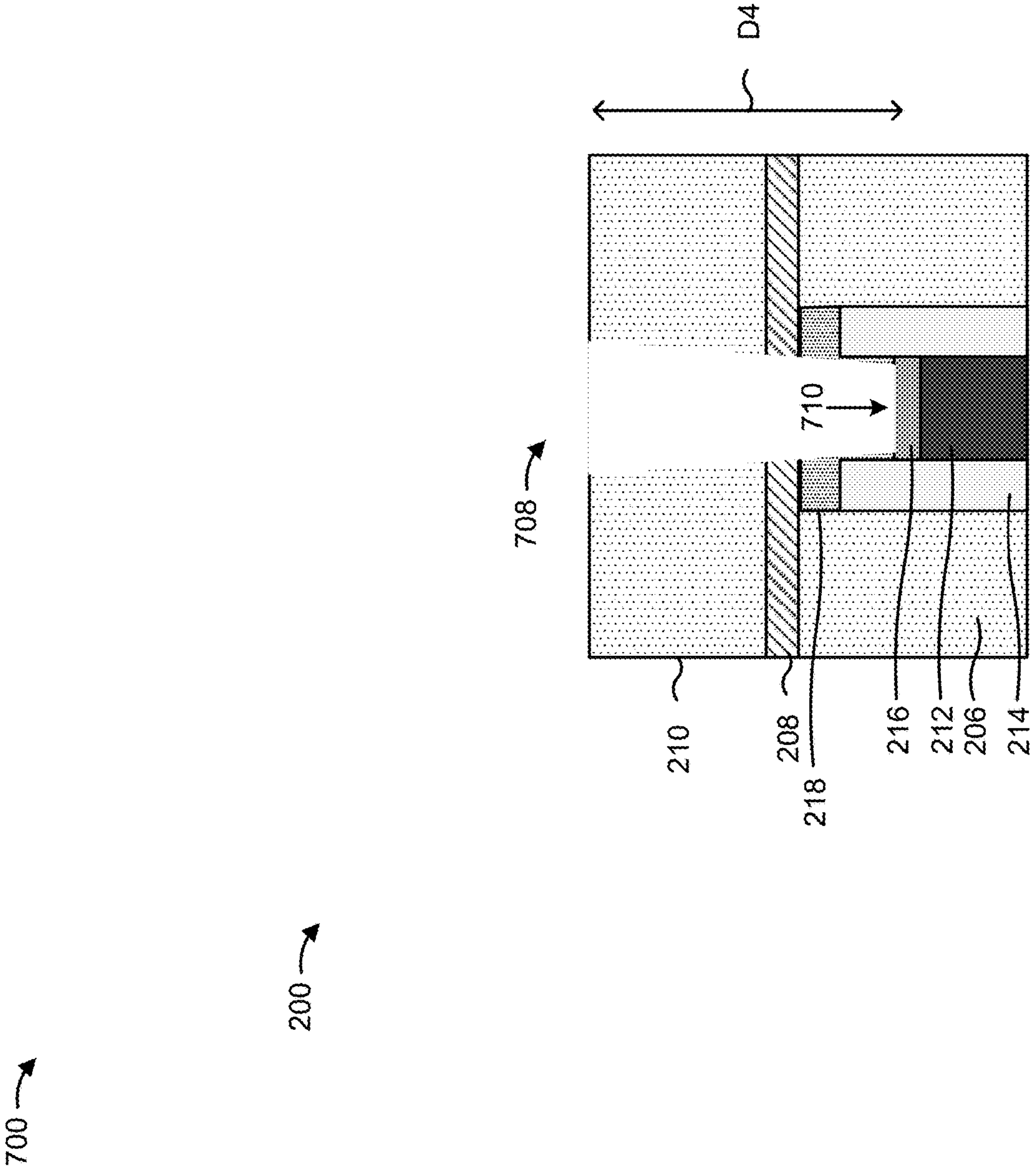

As shown in FIG. 7F, the etch tool 108 performs a second etch operation (e.g., after the first etch operation, after the dry ashing operation, after the first wet cleaning operation) to form the opening 708 to a second depth (D4). The second depth (D4) is greater than the first depth (D3) such that the bottom 710 of the opening 708 corresponds to the top surface of the metal capping layer 216. In this way, the top surface of the metal capping layer 216 is exposed through the opening 708. The first etch operation may include a dry etch operation such as a plasma-based etch operation that includes the use of a plasma (e.g., a plasma-based dry etch).

In some implementations, a second wet cleaning operation is performed after the second etch operation and prior to filling the opening 708 with a conductive material for the gate interconnect structure 224. For example, the wet cleaning tool 114 may perform the second wet cleaning operation to remove residual materials and/or native oxides from the opening 708 to increase bonding of the conductive material to the bottom 710 and the sidewalls of the opening 708 and to reduce contact resistance for the gate interconnect structure 224. However, in some implementations, the second wet cleaning operation may be omitted.

In some implementations, the first wet cleaning operation and the second wet cleaning operation are performed by the same wet cleaning tool 114 and/or in the same processing chamber of the same wet cleaning tool 114. In some implementations, the first wet cleaning operation and the second wet cleaning operation are performed by different wet cleaning tools 114 and/or in different processing chambers. In some implementations, the first wet cleaning operation and the second wet cleaning operation are performed using the same wet chemicals. In some implementations, the first wet cleaning operation and the second wet cleaning operation are performed using different wet chemicals. For example, the first wet cleaning operation may be performed using hydrochloric acid (HCl) and the second wet cleaning operation may be performed using water ($H_2O$), benzotriazole (BTA), and/or another wet chemical.

Figure 7G:
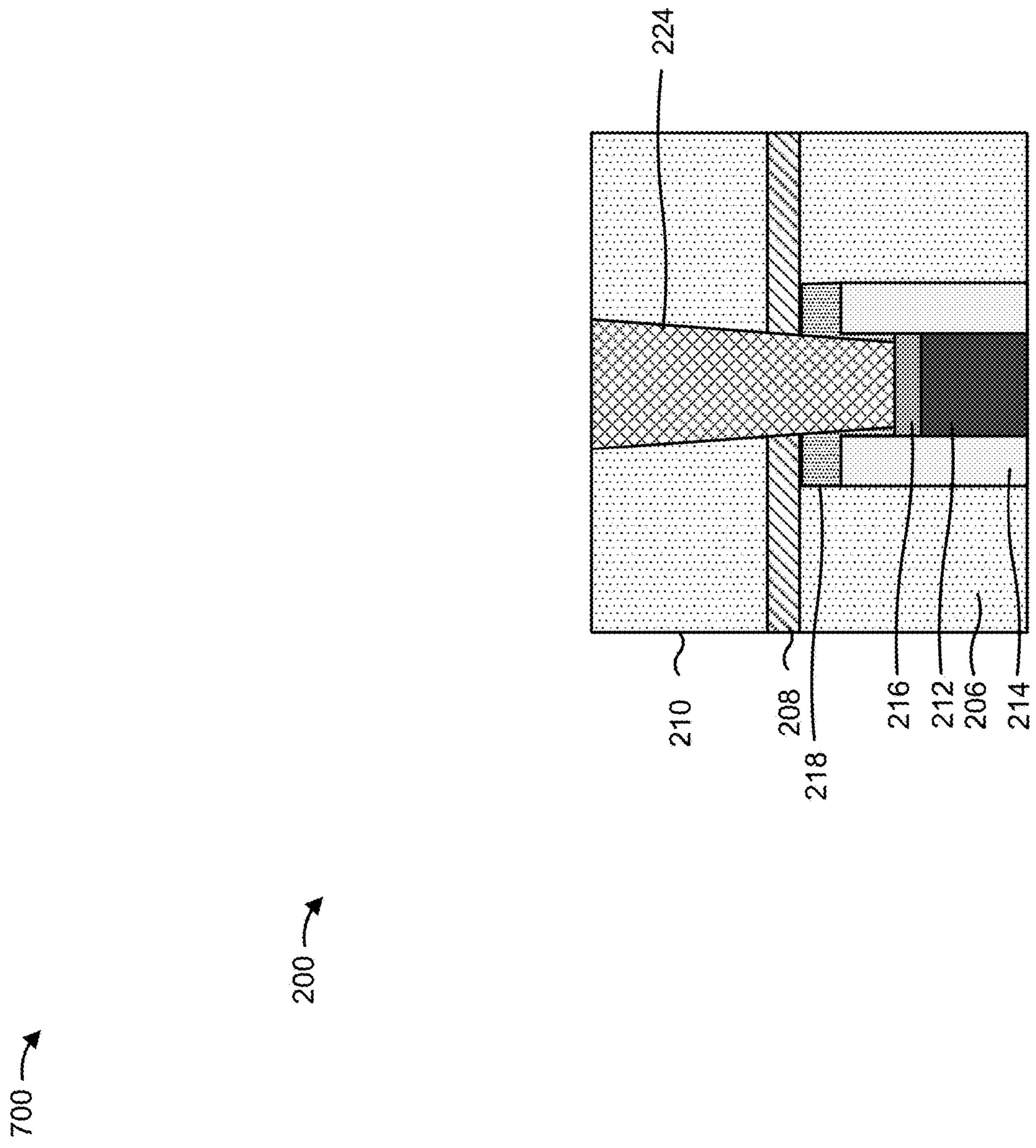

As shown in FIG. 7G, the opening 708 is filled with a conductive material (or a conductive material composition) to form the gate interconnect structure 224 in the opening 708. In particular, the conductive material is deposited over the metal capping layer 216 through the opening 708. In some implementations, the deposition tool 102 performs a PVD operation, a CVD operation, or another type of deposition operation to form the gate interconnect structure 224 in the opening 708. In some implementations, the plating tool 112 performs a plating operation such as an electroplating operation to form the gate interconnect structure 224 in the first portion of the opening 708. In some implementations, the deposition tool 102 performs a deposition operation to deposit a seed layer in the opening 708 to promote adhesion of the conductive material to the sidewalls, and the deposition tool 102 performs another deposition operation (or the plating tool 112 performs a plating operation) to fill in the remaining portion of the gate interconnect structure 224 over the seed layer.

As indicated above, FIGS. 7A-7G are provided as one or more examples. Other examples may differ from what is described with regard to FIGS. 7A-7G.

FIGS. 8A-8L are diagrams of an example implementation 800 described herein. The example implementation 800 includes an example of forming the gate interconnect structure 224 illustrated in FIG. 2 and/or elsewhere herein. Moreover, the example implementation 800 includes an example of performing a dry-wet-dry process flow that includes a two-step etch technique to form an opening in which the gate interconnect structure 224 is to be formed. In some implementations, one or more operations and/or techniques described in connection with FIGS. 8A-8L may be performed as part of the example implementation 600 of FIGS. 6A-6G and/or the example implementation 700 of FIGS. 7A-7G. In some implementations, one or more operations and/or techniques described in connection with FIGS. 8A-8L may be performed as an alternative to one or more operations and/or techniques of the example implementation 600 of FIGS. 6A-6G and/or of the example implementation 700 of FIGS. 7A-7G.

Figure 8A:
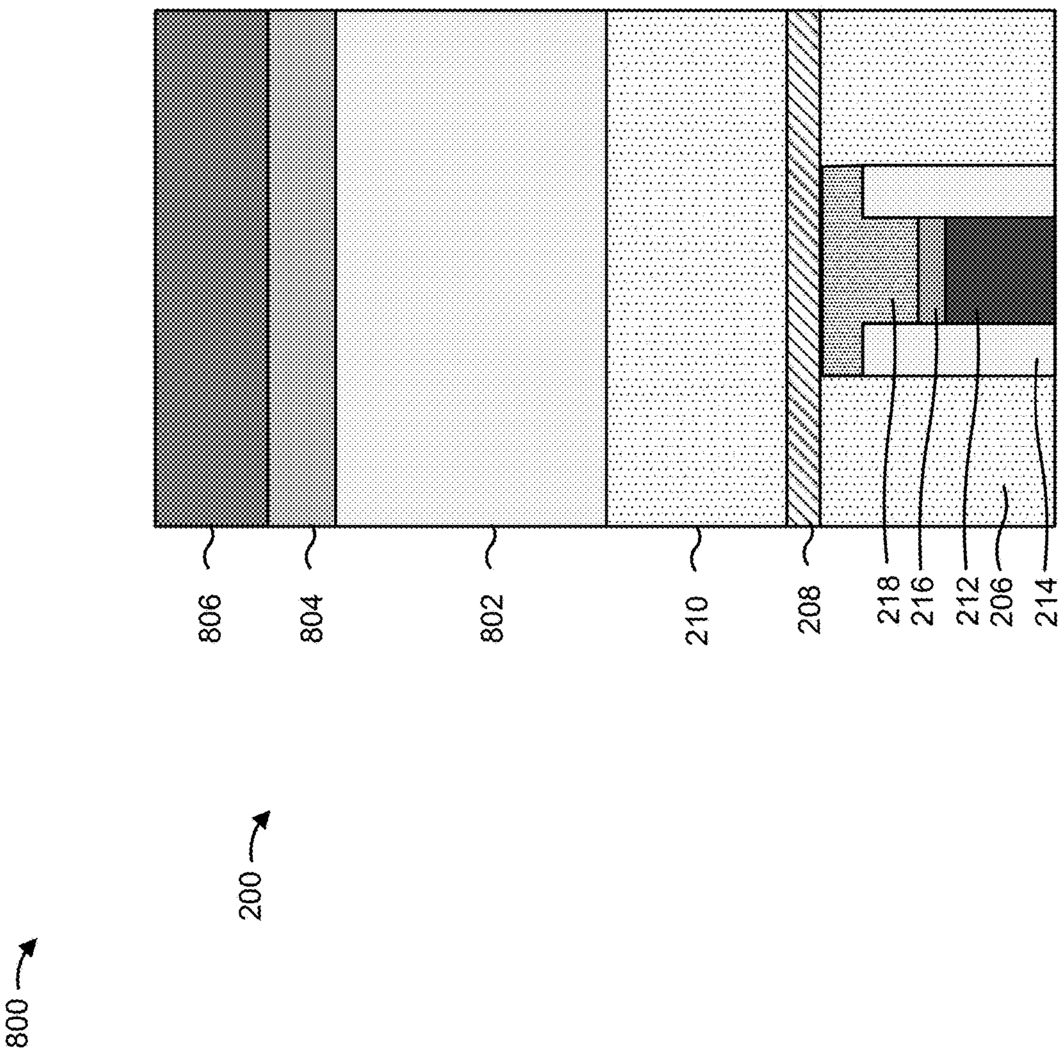

As shown in FIG. 8A, the deposition tool 102 may form a plurality of patterning layers over and/or on the dielectric layer 210. The plurality of patterning layers may include a bottom hard mask layer (BL) 802 over and/or on the dielectric layer 210, a middle hard mask layer (ML) 804 over and/or on the bottom hard mask layer 802, and a photoresist layer (PR) 806 over and/or on the middle hard mask layer 804. The deposition tool 102 performs a PVD operation, a CVD operation, or another type of deposition operation to form the plurality of patterning layers.

Figure 8B:
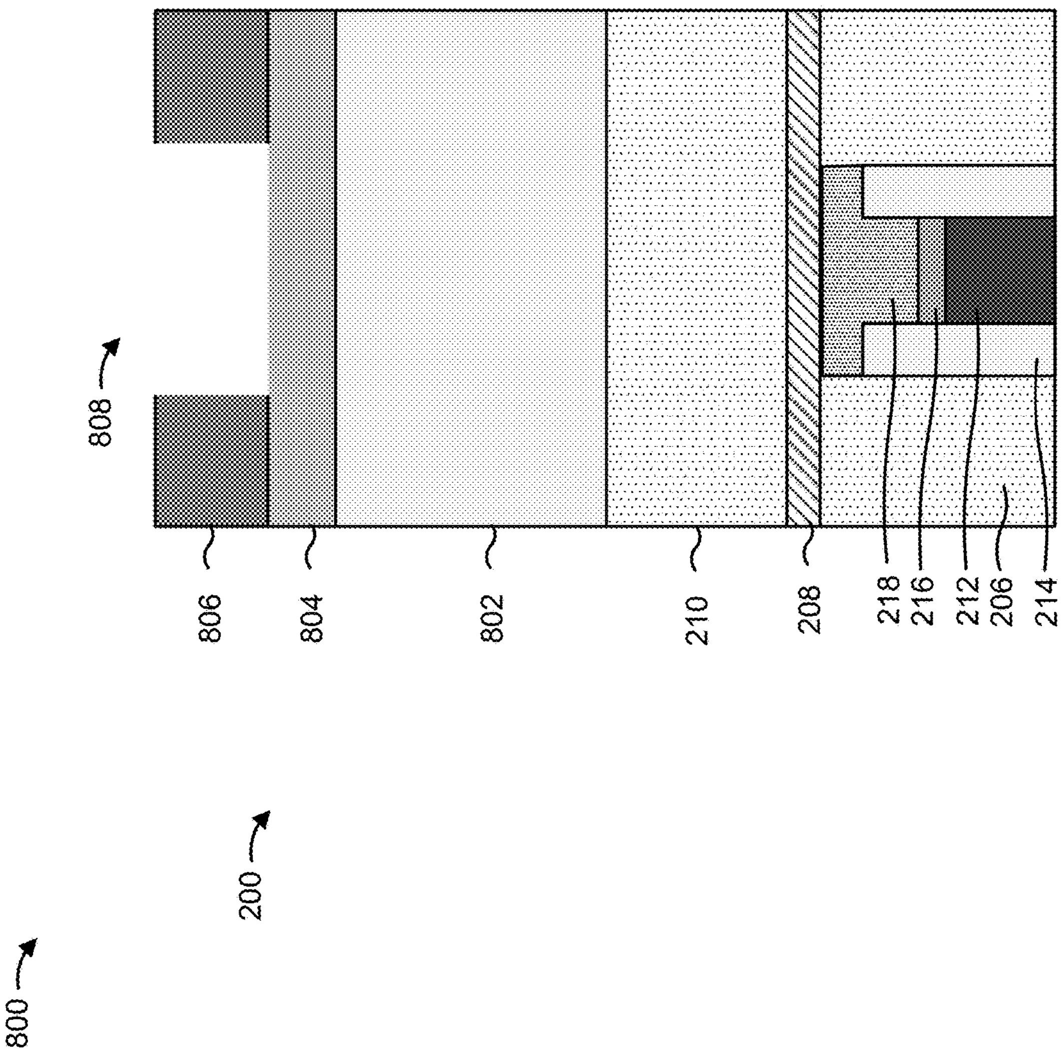

As shown in FIG. 8B, one or more of the semiconductor processing tools may form a pattern 808 in the photoresist layer 806. The pattern 808 may be used (e.g., by the etch tool 108) to form an opening to the metal capping layer 216 (or to the metal gate structure 212) in which the gate interconnect structure 224 is to be formed. For example, the exposure tool 104 may expose the photoresist layer 806 to a radiation source to pattern the photoresist layer 806. The developer tool 106 develops and removes portions of the photoresist layer 806 to expose the pattern. The operation to form the pattern 808 in the photoresist layer 806 may be referred to as a de-scum (DS) operation. The etch tool 108 may perform a part of the de-scum operation using one or more reactants and/or processing gasses, such as nitrogen ($N_2$) and/or hydrogen ($H_2$), among other examples.

Figure 8C:
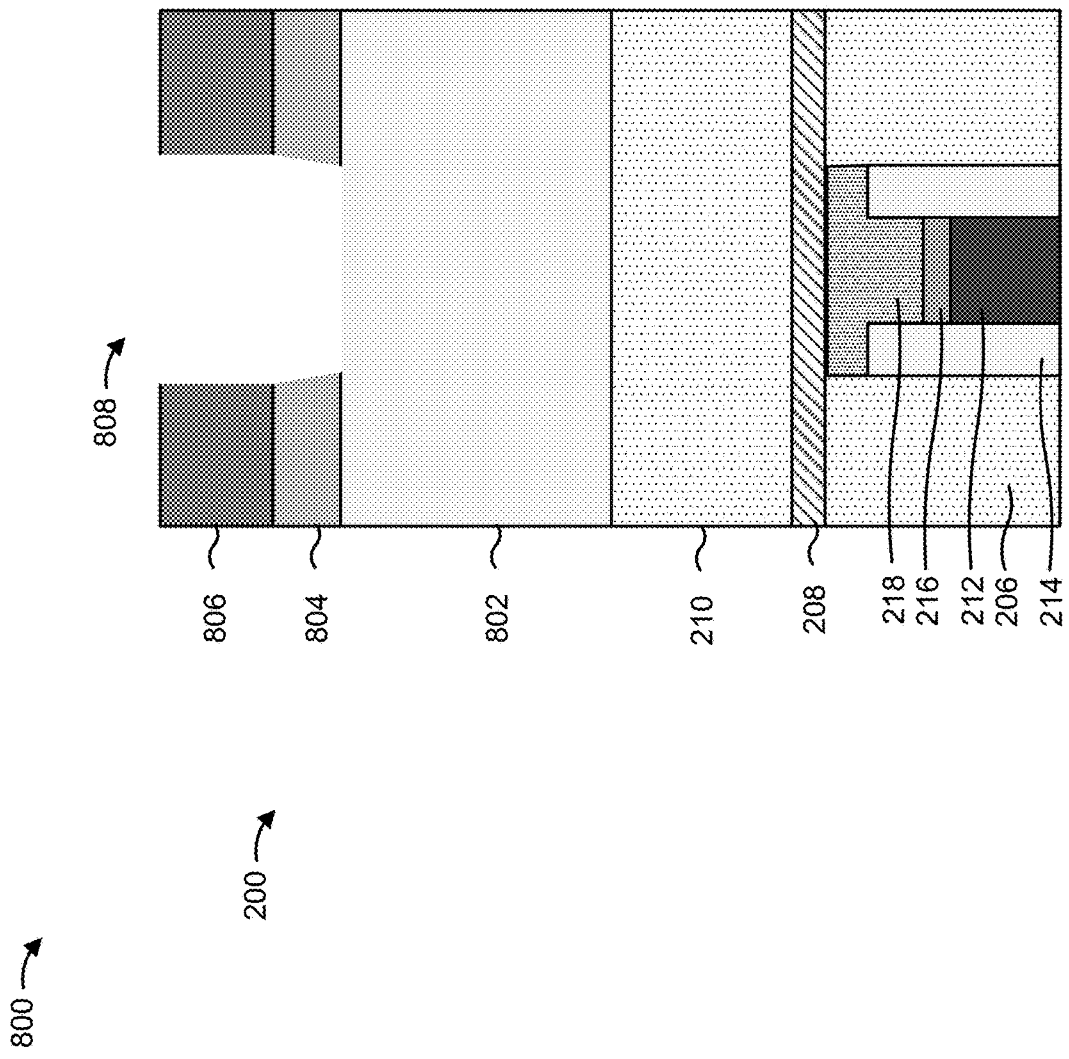

As shown in FIG. 8C, the etch tool 108 may etch the middle hard mask layer 804 to extend the pattern 808 through the middle hard mask layer 804. The etch tool 108 may remove a portion of the middle hard mask layer 804 using one or more reactants and/or processing gasses, such as a fluoroform ($CHF_x$ such as $CHF_3$), tetrafluoromethane ($CF_4$), and/or nitrogen ($N_2$), among other examples.

Figure 8D:
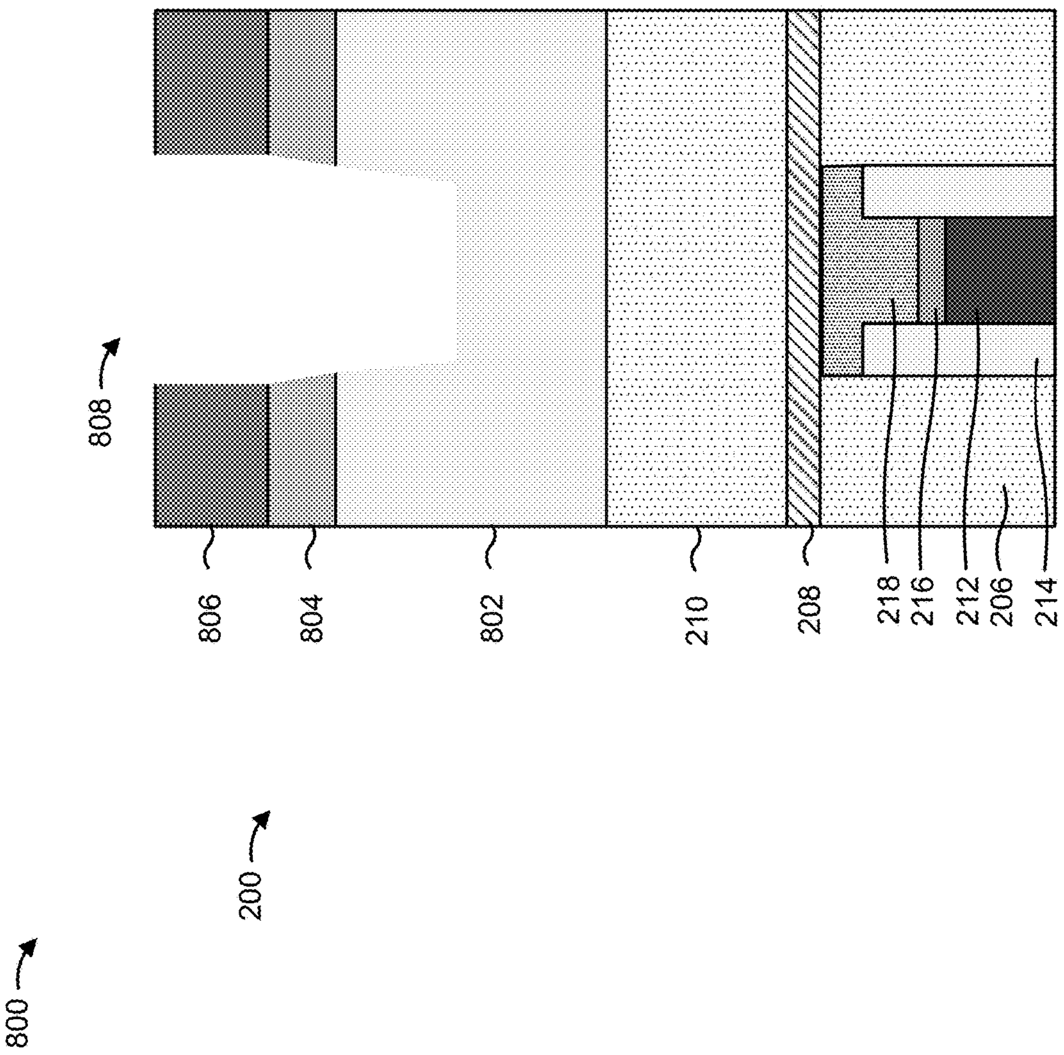

As shown in FIG. 8D, the etch tool 108 may etch the bottom hard mask layer 802 to extend the pattern 808 into a first portion of the bottom hard mask layer 802. This may be referred to as a BL1 operation. The etch tool 108 may remove a portion of the bottom hard mask layer 802 using one or more reactants and/or processing gasses, such as nitrogen ($N_2$) and/or hydrogen ($H_2$), among other examples.

Figure 8E:
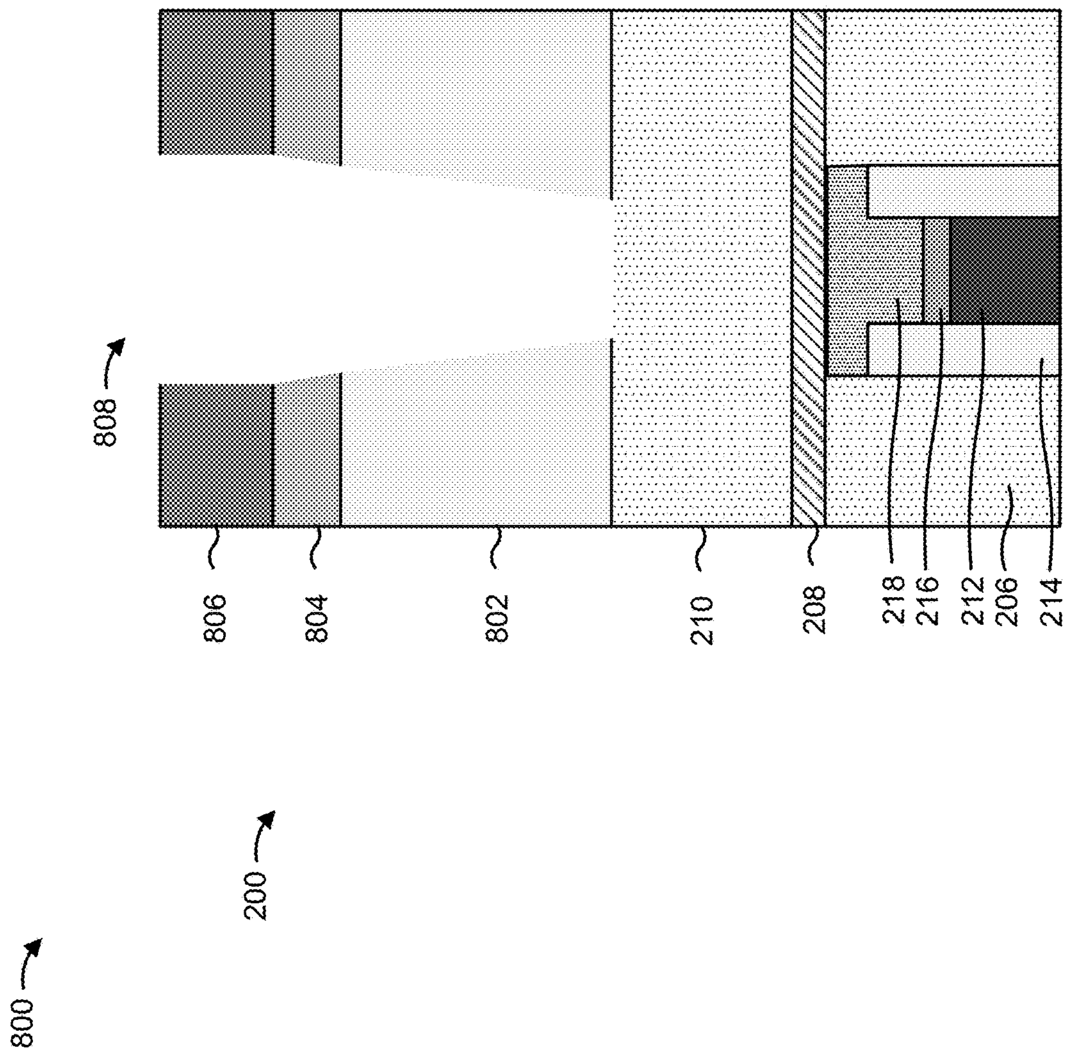

As shown in FIG. 8E, the etch tool 108 may etch the bottom hard mask layer 802 to extend the pattern 808 into a second portion of the bottom hard mask layer 802 below the first portion. This may be referred to as a BL2 operation. In the BL2 operation, the pattern 808 is fully extended through the bottom hard mask layer 802 and to a top surface of the dielectric layer 210. The etch tool 108 may remove a portion of the bottom hard mask layer 802 using one or more reactants and/or processing gasses, such as carbonyl sulfide (COS), oxygen ($O_2$), nitrogen ($N_2$) and/or argon (Ar), among other examples.

Figure 8F:
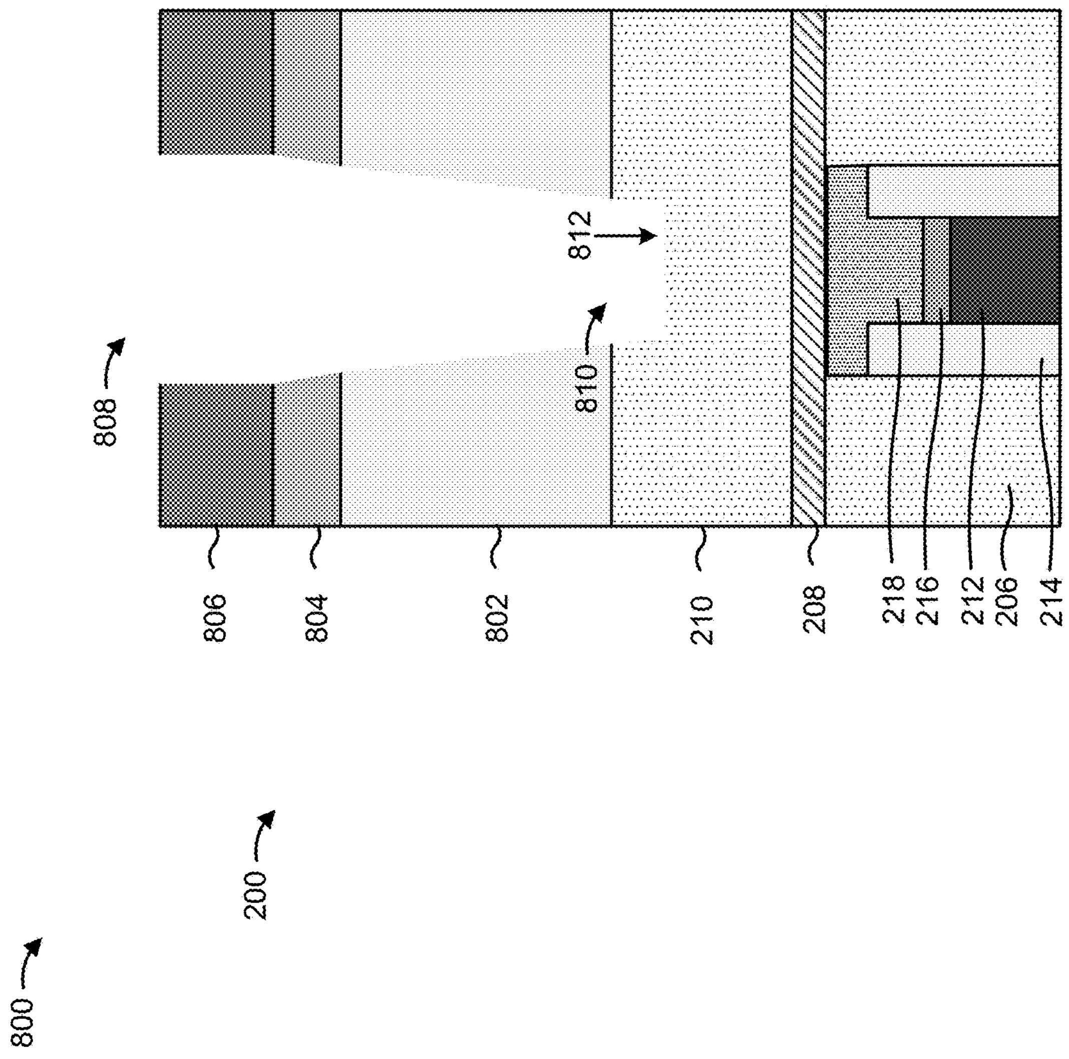

As shown in FIG. 8F, the etch tool 108 may etch the dielectric layer 210 based on the pattern 808 to form an opening 810 into a first portion of the dielectric layer 210. This may be referred to as a main etch operation. The etch tool 108 etches the dielectric layer 210 such that a bottom 812 of the opening 810 is formed into the dielectric layer 210. The etch tool 108 may remove a portion of the dielectric layer 210 using one or more reactants and/or processing gasses, such as a fluoroform ($CHF_x$ such as $CHF_3$), tetrafluoromethane ($CF_4$), argon (Ar), and/or nitrogen ($N_2$), among other examples.

Moreover, the etch tool 108 may facilitate plasma generation and/or ion bombardment in the processing chamber 116 by operating the RF sources 138*a* and 138*b* in respective frequency ranges. In some implementations, a first RF source of the RF sources 138*a* and 138*b* may be operated (e.g., may generate RF power) in a frequency range of approximately 27 megahertz (MHz) to approximately 60 MHz. However, other values for the range are within the scope of the present disclosure. In some implementations, a first RF source of the RF sources 138*a* and 138*b* may be operated (e.g., may generate RF power) in a frequency range of approximately 2 MHz to approximately 16 MHz. However, other values for the range are within the scope of the present disclosure.

Figure 8G:
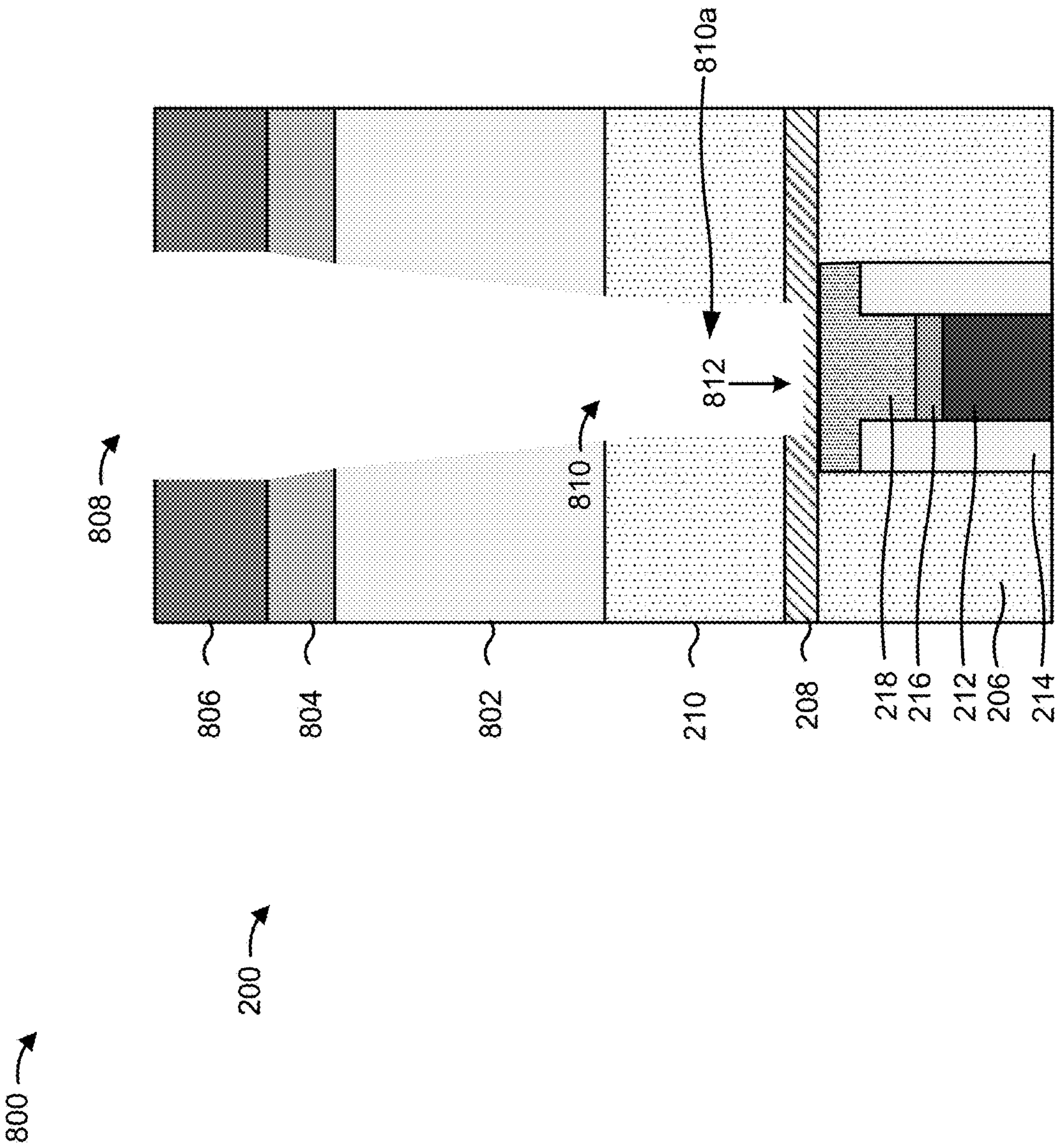

As shown in FIG. 8G, the etch tool 108 may further etch the dielectric layer 210 to increase the depth of the opening 810. This may be referred as an over etch (OE) operation. In particular, the etch tool 108 extends the opening 810 through the dielectric layer 210 such that the bottom 812 of the opening 810 is in a portion of the ESL 208. In this way, the etch tool 108 forms an approximately straight portion 810*a* of the opening 810 through the dielectric layer 210 and into a portion of the ESL 208. Alternatively, the etch tool 108 may extend the opening 810 such that the bottom 812 of the opening 810 corresponds to a top surface of the ESL 208 or corresponds to a top surface of the dielectric capping layer 218. The etch tool 108 may remove a portion of the dielectric layer 210 and/or the ESL 208 using one or more reactants and/or processing gasses, such as a fluoroform ($CH_xF_y$ such as $CH_2F_2$), hexafluorobutadiene ($C_4F_6$), octafluorocyclobutane ($C_4F_8$), helium (He), oxygen ($O_2$), and/or nitrogen ($N_2$), among other examples.

Figure 8H:
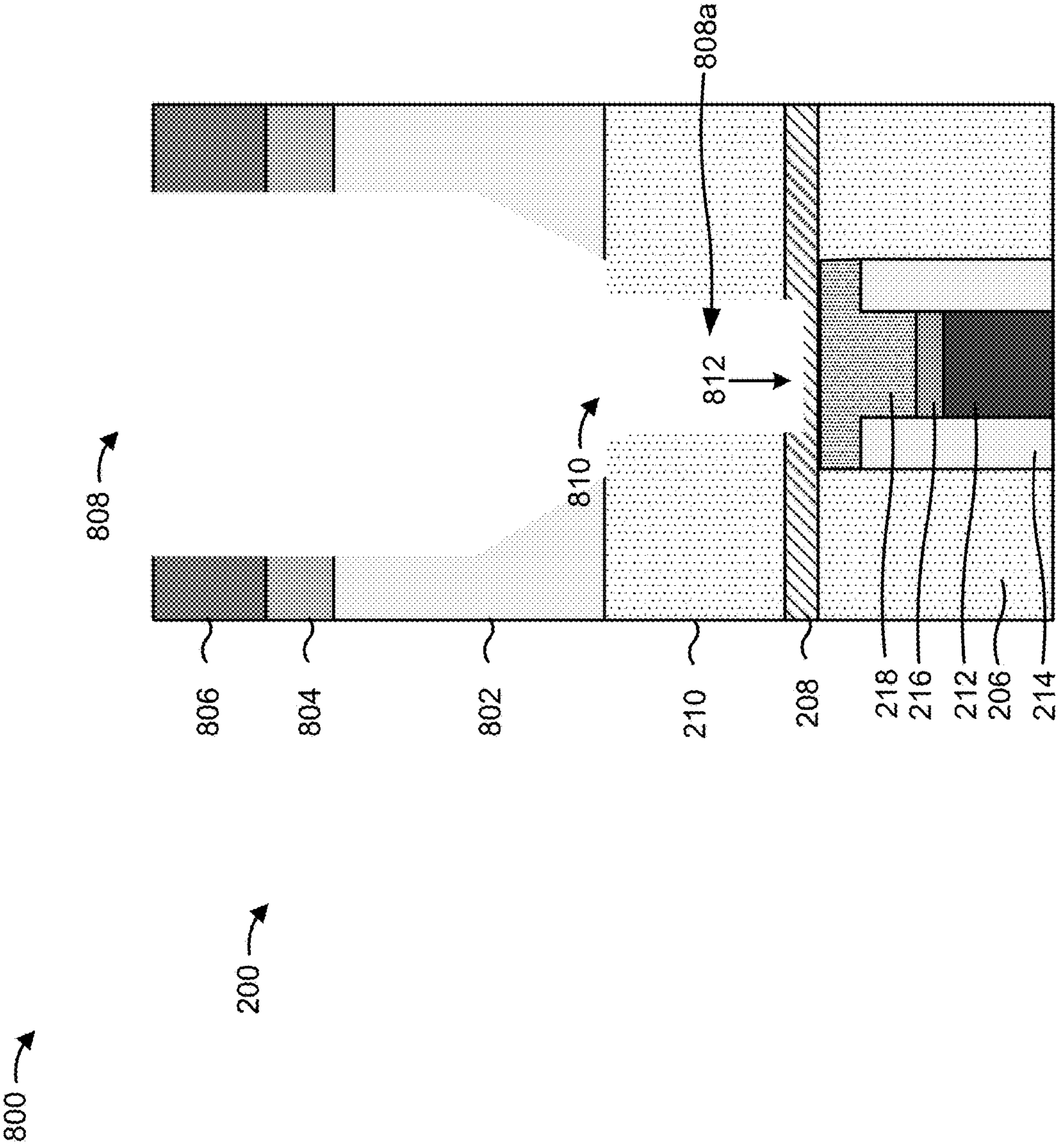

As shown in FIG. 8H, the etch tool 108 may etch the photoresist layer 806, the middle hard mask layer 804, and/or the bottom hard mask layer 802 to increase the width or size of the pattern 808. This may be referred to as a pull-back (PB) operation. The etch tool 108 may remove portions of the photoresist layer 806, the middle hard mask layer 804, and/or the bottom hard mask layer 802 using an oxygen-based plasma and/or one or more other reactants and/or processing gasses.

Figure 8I:
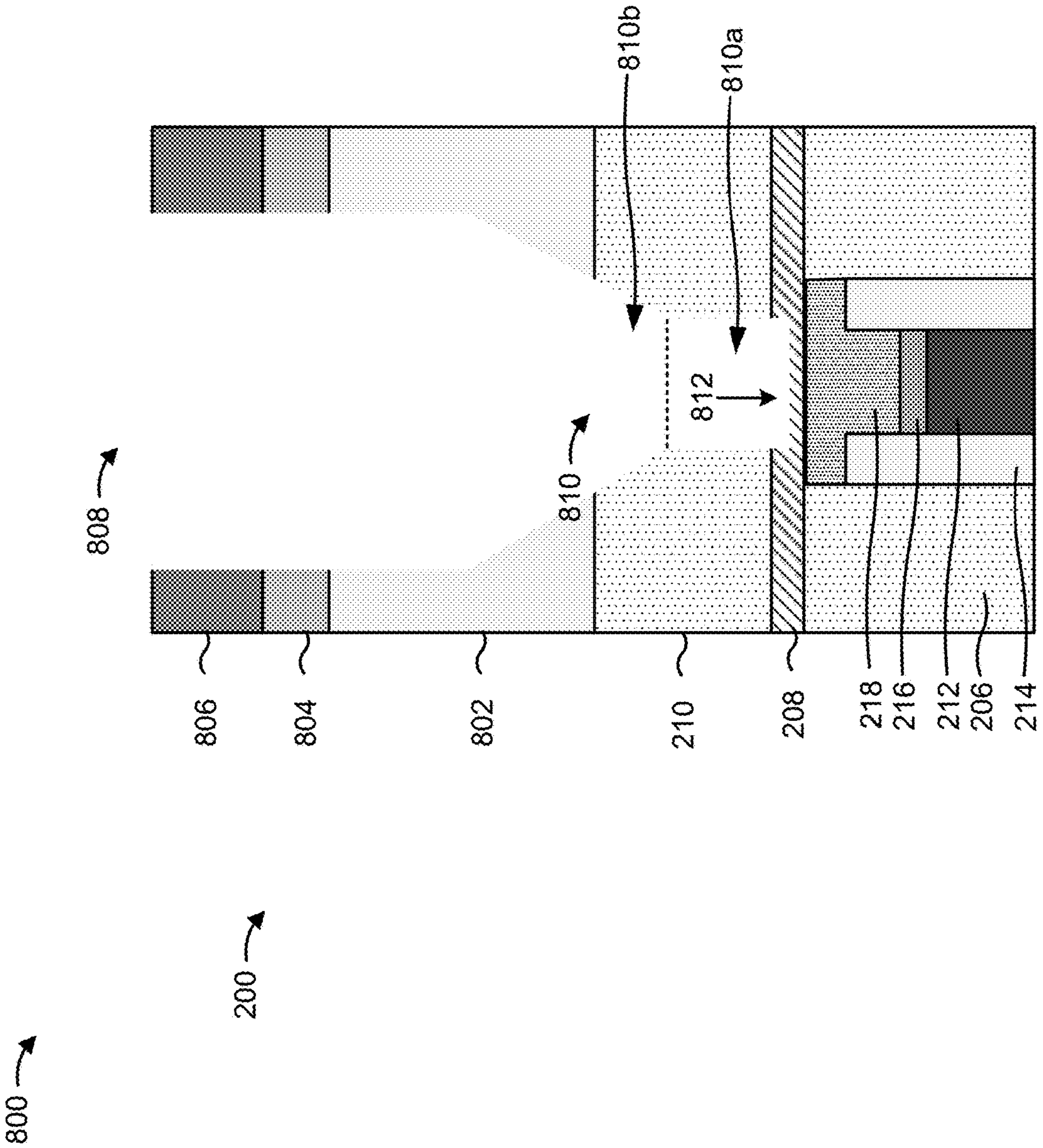

As shown in FIG. 8I, the etch tool 108 may etch the dielectric layer 210 based on the pattern 808 (e.g., after the width or size of the pattern 808 is increased in the pull-back operation) to form an angled (or tapered) portion 810*b* of the opening 810 in the dielectric layer 210. This may be referred to as a corner rounding (CR) operation. The angled portion 810*b* may be formed above the approximately straight portion 810*a* in the dielectric layer 210. The etch tool 108 may remove a portion of the dielectric layer 210 using one or more reactants and/or processing gasses, such as an octafluorocyclobutane ($C_4F_8$), nitrogen ($N_2$), and/or hydrogen ($H_2$), among other examples.

The etch operations described in connection with FIGS. 8F, 8G, and 8I may include dry etch operations that are performed as a "first etch operation" or a "one or more first etch operations" described in connection with FIGS. 6C, 7C, 7D, and/or elsewhere herein.

Figure 8J:
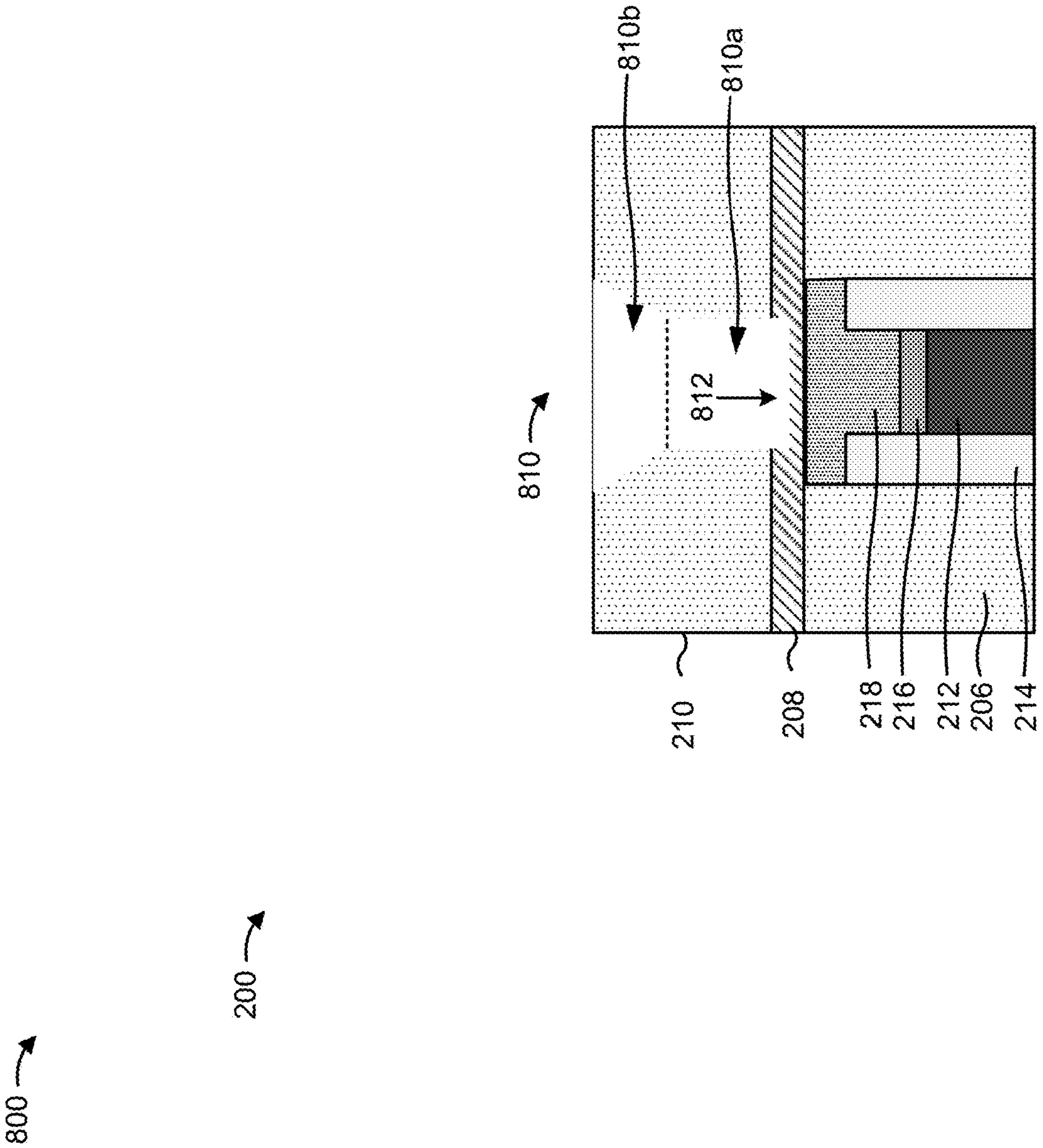

As shown in FIG. 8J, and as described herein, the etch tool 108 may perform a dry ashing operation to remove the plurality of patterning layers (e.g., the bottom hard mask layer 802, the middle hard mask layer 804, and/or the photoresist layer 806) from the semiconductor device 200 after the operations described in connection with FIGS. 8A-8I. In particular, the etch tool 108 may perform a dry ashing operation in the same processing chamber 116 (e.g., in-situ or without breaking the vacuum in the processing chamber 116) as the etch operations described in connection with one or more of FIGS. 8B-8I. The dry ashing operation may include an oxygen-based plasma ashing operation and/or another type of dry ashing operation. Moreover, the wet cleaning tool 114 may perform a first wet cleaning operation after the dry ashing operation to remove residual materials and/or native oxides from the opening 810, as described above in connection with FIGS. 6D, 7E, and/or elsewhere herein.

Figure 8K:
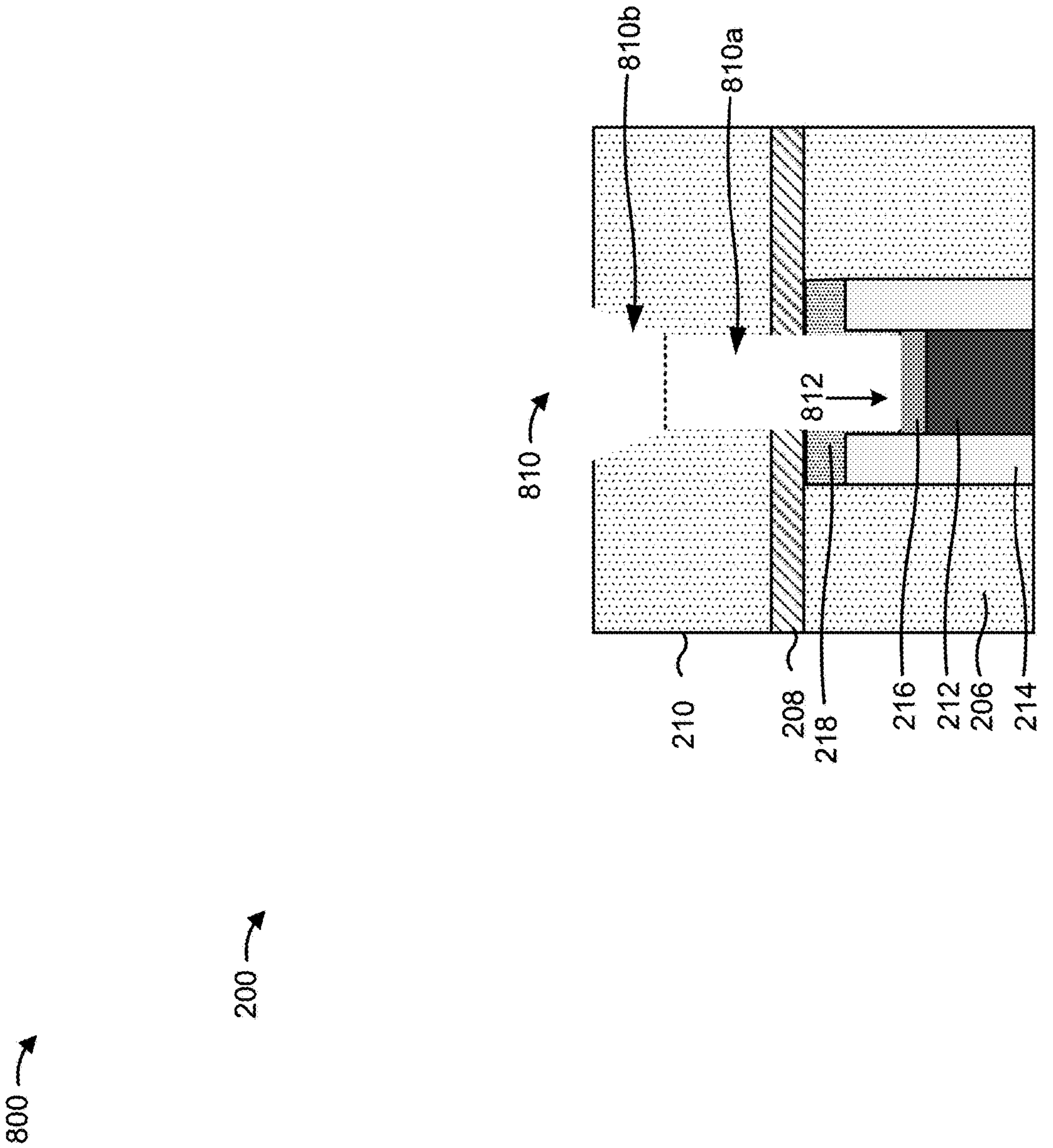

As shown in FIG. 8K, the etch tool 108 may etch through the ESL 208 (e.g., the remaining thickness of the ESL 208) and through the dielectric capping layer 218 to the top surface of the metal capping layer 216. This may be referred to as a linear removal (LRM) operation. The linear removal operation may correspond to the "second etch operation" described above in connection with FIGS. 6D, 7F, and/or elsewhere herein.

In the linear removal operation, the etch tool 108 exposes the top surface of the metal capping layer 216 through the opening 810. The etch tool 108 may remove portions of the ESL 208 and the dielectric capping layer 218 using one or more other reactants and/or processing gasses, such as hydrogen ($H_2$) and/or fluoroform ($CH_xF_y$ such as $CH_2F_2$), among other examples. Moreover, the etch tool 108 may perform an oxygen-based post etch treatment (PET) operation using polyethylene terephthalate and/or another processing chemical.

Figure 8L:
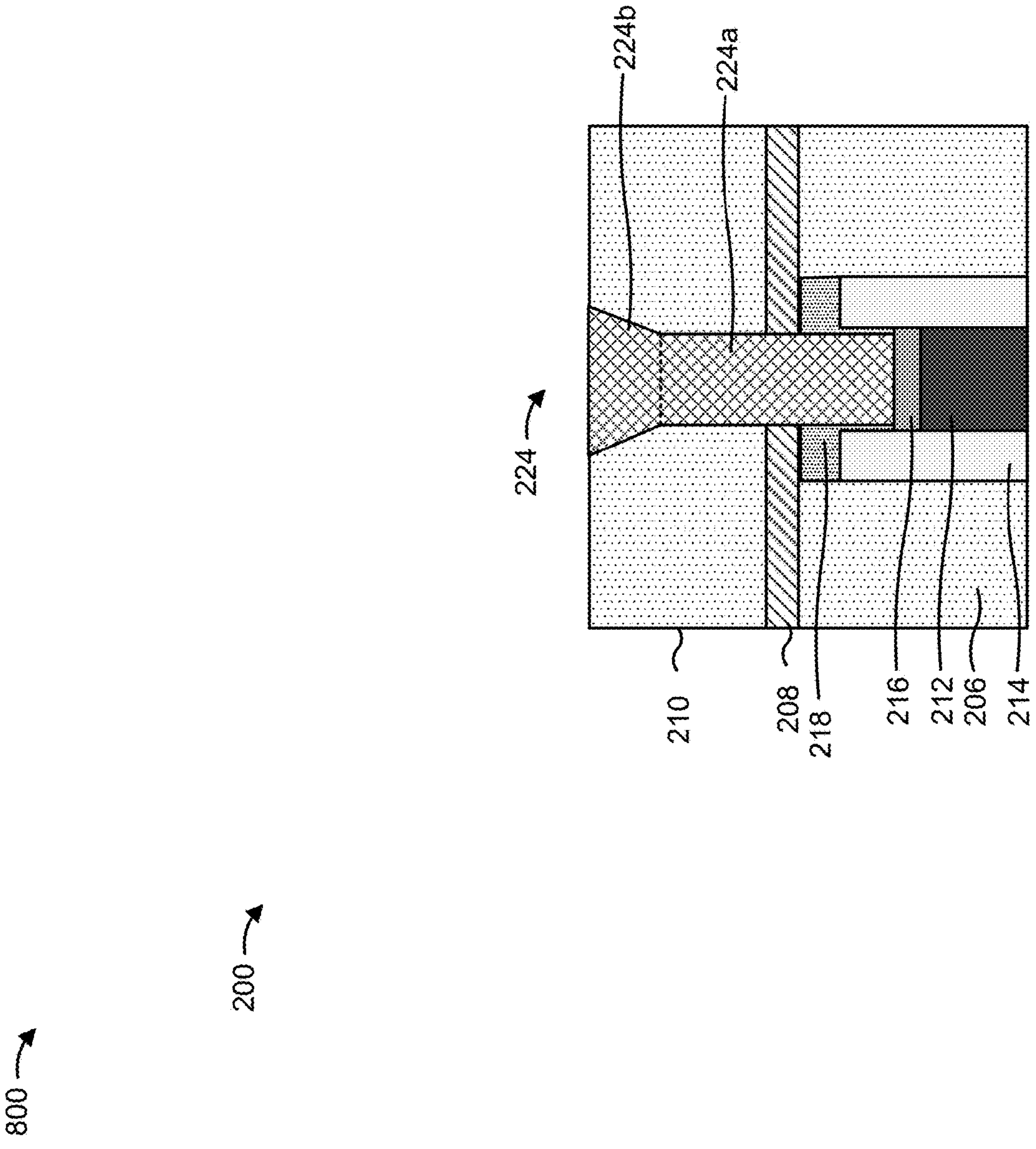

As shown in FIG. 8L, the opening 810 is filled with a conductive material (or a conductive material composition) to form the gate interconnect structure 224 in the opening 810. In particular, the conductive material is deposited over the metal capping layer 216 through the opening 810. In some implementations, the deposition tool 102 performs a PVD operation, a CVD operation, or another type of deposition operation to form the gate interconnect structure 224 in the opening 810. In some implementations, the plating tool 112 performs a plating operation such as an electroplating operation to form the gate interconnect structure 224 in the first portion of the opening 810. In some implementations, the deposition tool 102 performs a deposition operation to deposit a seed layer in the opening 810 to promote adhesion of the conductive material to the sidewalls, and the deposition tool 102 performs another deposition operation (or the plating tool 112 performs a plating operation) to fill in the remaining portion of the gate interconnect structure 224 over the seed layer.

As further shown in FIG. 8L, the shape of the gate interconnect structure 224 substantially conforms to the shape of the opening 810. In particular, the gate interconnect structure 224 includes an approximately straight portion 224*a* and an angled portion 224*b* over and/or above the approximately straight portion 224*a*. The approximately straight portion 224*a* may interface with the top surface of the metal capping layer 216 and may extend through the dielectric capping layer 218, the ESL 208, and a portion of the dielectric layer 210. The angled portion 224*b* may extend through another portion of the dielectric layer 210.

As indicated above, FIGS. 8A-8L are provided as one or more examples. Other examples may differ from what is described with regard to FIGS. 8A-8L.

Figure 9:
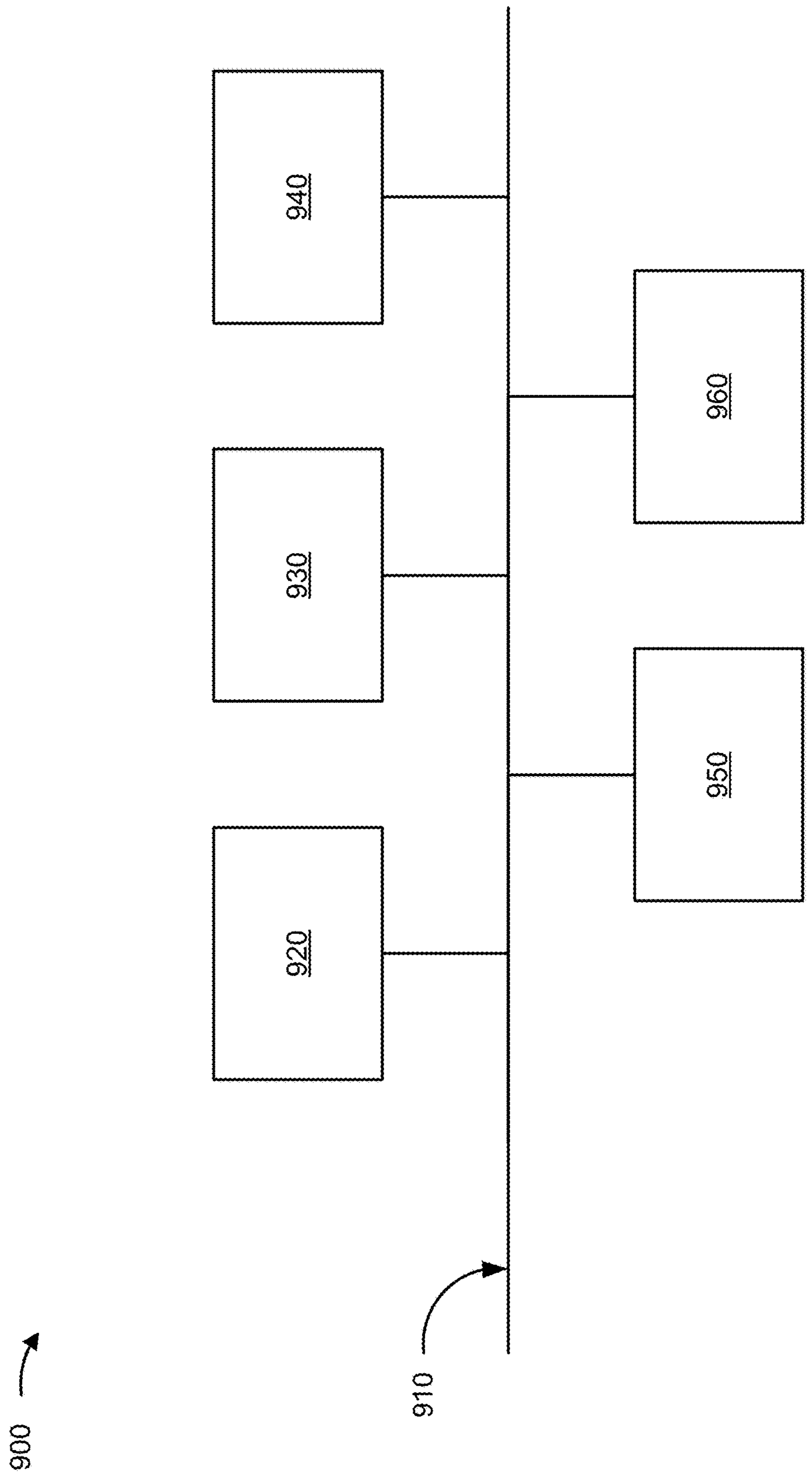
FIG. 9 is a diagram of example components of one or more devices of FIGS. 1A and/or 1B described herein.

FIG. 9 is a diagram of example components of a device 900. In some implementations, one or more of the semiconductor processing tools 102-114 and/or the wafer/die transport tool 115 include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
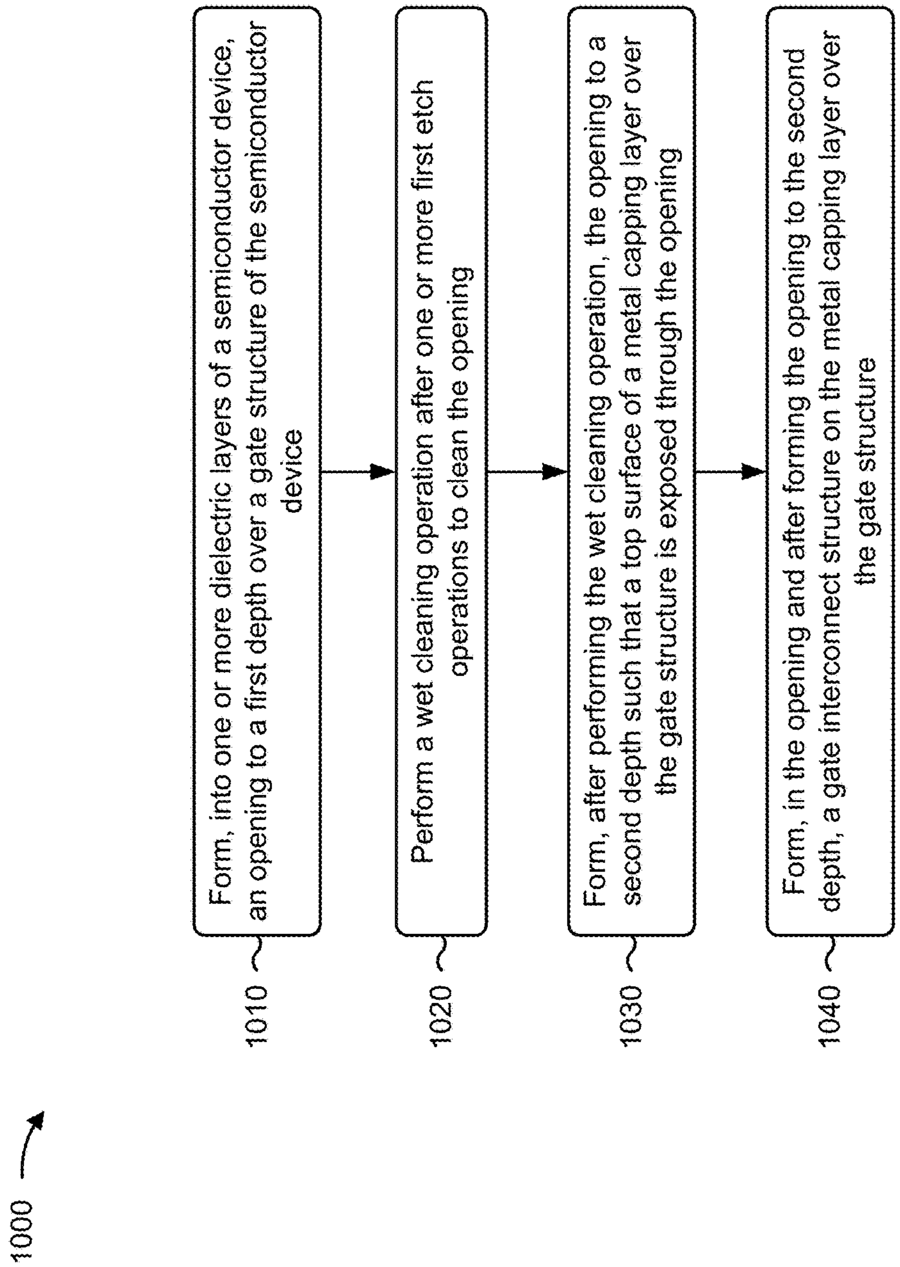
FIGS. 10 and 11 are flowcharts of example processes associated with forming a semiconductor device.

FIG. 10 is a flowchart of an example process 1000 associated with forming a semiconductor device. In some implementations, one or more process blocks of FIG. 10 are performed by one or more semiconductor processing tools (e.g., one or more of the semiconductor processing tools 102-114). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming, into one or more dielectric layers of a semiconductor device, an opening to a first depth over a gate structure of the semiconductor device (block 1010). For example, one or more of the semiconductor processing tools 102-114 may form, into one or more dielectric layers (e.g., an ESL 208, a dielectric layer 210) of a semiconductor device 200, an opening (e.g., an opening 602, an opening 708, an opening 810) to a first depth (D3) over a gate structure (e.g., a metal gate structure 212) of the semiconductor device 200, as described above. In some implementations, the opening is formed to the first depth (D3) in one or more first etch operations.

As further shown in FIG. 10, process 1000 may include performing a wet cleaning operation after the one or more first etch operations to clean the opening (block 1020). For example, one or more of the semiconductor processing tools 102-114 may perform a wet cleaning operation after the one or more first etch operations to clean the opening, as described above.

As further shown in FIG. 10, process 1000 may include forming, after performing the wet cleaning operation, the opening to a second depth such that a top surface of a metal capping layer over the gate structure is exposed through the opening (block 1030). For example, one or more of the semiconductor processing tools 102-114 may form, after performing the wet cleaning operation, the opening to a second depth (D4) such that a top surface of a metal capping layer 216 over the gate structure is exposed through the opening, as described above. In some implementations, the second depth (D4) is greater than the first depth (D3). In some implementations, the opening is formed to the second depth (D4) in a second etch operation.

As further shown in FIG. 10, process 1000 may include forming, in the opening and after forming the opening to the second depth, a gate interconnect structure on the metal capping layer over the gate structure (block 1040). For example, one or more of the semiconductor processing tools 102-114 may form, in the opening and after forming the opening to the second depth (D4), a gate interconnect structure 224 on the metal capping layer 216 over the gate structure, as described above.

Process 1000 may include additional implementations, such as any single implementation or any combination of implementations described below and/or in connection with one or more other processes described elsewhere herein.

In a first implementation, process 1000 includes performing another wet cleaning operation after the second etch operation and prior to forming the gate interconnect structure 224 to clean the opening. In a second implementation, alone or in combination with the first implementation, performing the first wet cleaning operation includes performing the first wet cleaning operation using a first wet chemical, and performing the second wet cleaning operation includes performing the second wet cleaning operation using a second wet chemical, where the first wet chemical and the second wet chemical are different wet chemicals.

In a third implementation, alone or in combination with one or more of the first and second implementations, the first wet chemical includes hydrochloric acid (HCl), and the second wet chemical includes water ($H_2O$) and benzotriazole (BTA).

In a fourth implementation, alone or in combination with one or more of the first through third implementations, performing the first wet cleaning operation includes performing the first wet cleaning operation using a first wet cleaning tool 114, and wherein performing the second wet cleaning operation includes performing the second wet cleaning operation using a second wet cleaning tool 114, where the first wet cleaning tool 114 and the second wet cleaning tool 114 are different wet cleaning tools 114. In a fifth implementation, alone or in combination with one or more of the first through fourth implementations, forming the opening to the first depth (D3) includes forming the opening to the first depth (D3) such that a bottom (e.g., a bottom 604, a bottom 710, a bottom 812) of the opening is formed to a top of an etch stop layer (e.g., an ESL 208) above the gate structure. In a sixth implementation, alone or in combination with one or more of the first through fifth implementations, forming the opening to the first depth (D3)

includes forming the opening to the first depth (D3) such that a bottom (e.g., a bottom 604, a bottom 710, a bottom 812) of the opening is formed into a portion of an etch stop layer (e.g., an ESL 208) above the gate structure.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Figure 11:
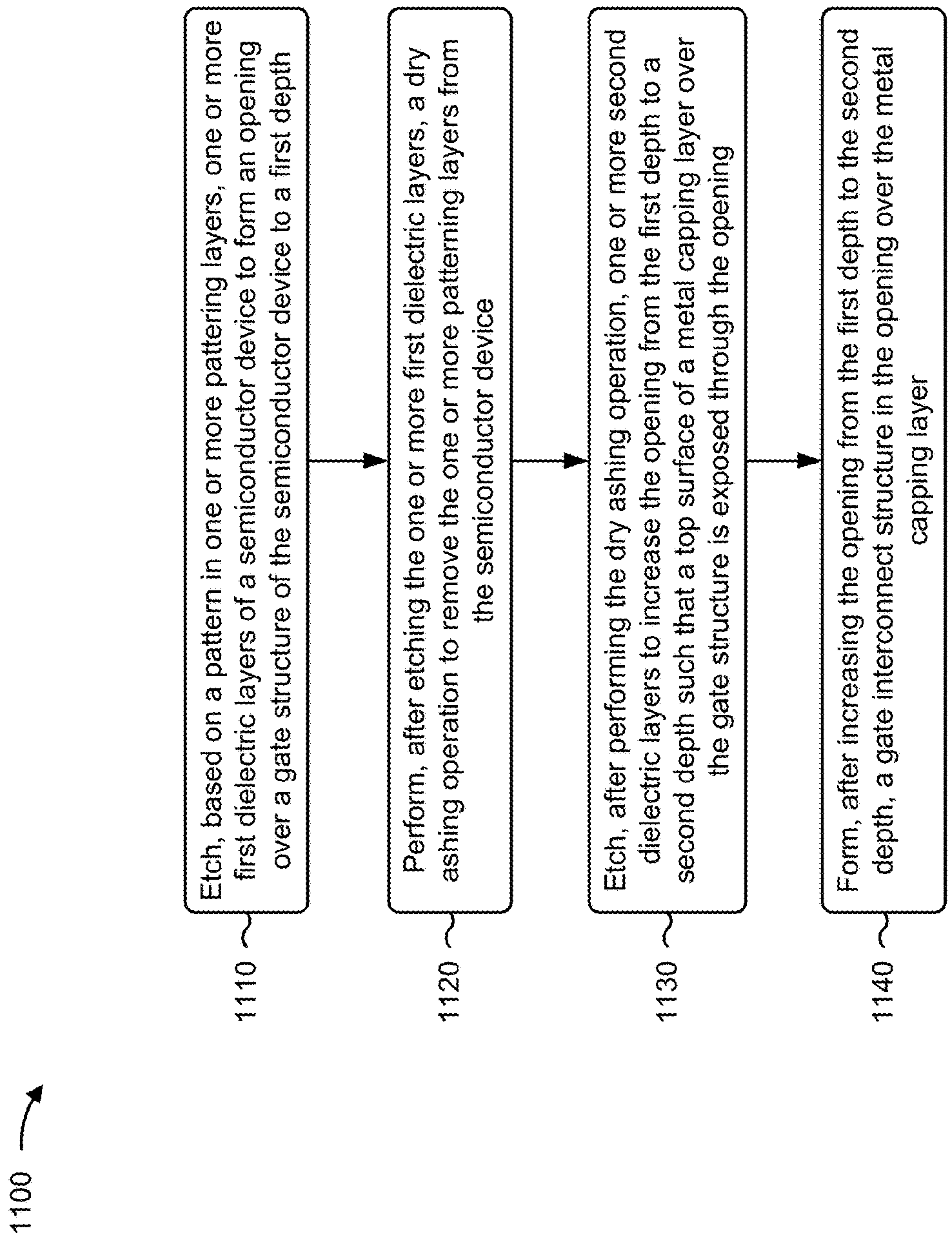

FIG. 11 is a flowchart of an example process 1100 associated with forming a semiconductor device. In some implementations, one or more process blocks of FIG. 11 are performed by one or more semiconductor processing tools (e.g., the one or more semiconductor processing tools 102-114). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include etching, based on a pattern in one or more pattering layers, one or more first dielectric layers of a semiconductor device to form an opening over a gate structure of the semiconductor device to a first depth (block 1110). For example, one or more of the semiconductor processing tools 102-114 may etch, based on a pattern 808 in one or more pattering layers (e.g., one or more of the layers 702, 704, 706, 802, 804, and/or 806), one or more first dielectric layers (e.g., an ESL 208, a dielectric layer 210) of a semiconductor device 200 to form an opening (e.g., an opening 602, an opening 708, an opening 810) over a gate structure (e.g., a metal gate structure 212) of the semiconductor device 200 to a first depth (D3), as described above.

As further shown in FIG. 11, process 1100 may include performing, after etching the one or more first dielectric layers, a dry ashing operation to remove the one or more patterning layers from the semiconductor device (block 1120). For example, one or more of the semiconductor processing tools 102-114 may perform, after etching the one or more first dielectric layers, a dry ashing operation to remove the one or more patterning layers from the semiconductor device 200, as described above. In some implementations, the dry ashing operation and etching the one or more first dielectric layers are performed in a same processing chamber 116 of a semiconductor processing tool (e.g., an etch tool 108).

As further shown in FIG. 11, process 1100 may include etching, after performing the dry ashing operation, one or more second dielectric layers to increase the opening from the first depth to a second depth such that a top surface of a metal capping layer over the gate structure is exposed through the opening (block 1130). For example, one or more of the semiconductor processing tools 102-114 may etch, after performing the dry ashing operation, one or more second dielectric layers (e.g., an ESL 208, a dielectric capping layer 218) to increase the opening from the first depth (D3) to a second depth (D4) such that a top surface of a metal capping layer 216 over the gate structure is exposed through the opening, as described above.

As further shown in FIG. 11, process 1100 may include forming, after increasing the opening from the first depth to the second depth, a gate interconnect structure in the opening over the metal capping layer (block 1140). For example, one or more of the semiconductor processing tools 102-114 may form, after increasing the opening from the first depth (D3) to the second depth (D4), a gate interconnect structure 224 in the opening over the metal capping layer 216, as described above.

Process 1100 may include additional implementations, such as any single implementation or any combination of implementations described below and/or in connection with one or more other processes described elsewhere herein.

In a first implementation, process 1100 includes forming the pattern through a photoresist layer 806 of the one or more patterning layers, forming the pattern 808 through a first mask layer 804, of the one or more patterning layers, below the photoresist layer 806, forming, using a first process gas combination, the pattern 808 through a first portion of a second mask layer 802, of the one or more patterning layers, below the first mask layer 804, and forming, using a second process gas combination, the pattern 808 through a second portion of the second mask layer 802 below the first portion such that a top surface of a dielectric layer 210 of the one or more first dielectric layers is exposed through the pattern 808, where the first process gas combination and the second process gas combination are different process gas combinations. In a second implementation, alone or in combination with the first implementation, etching the one or more first dielectric layers to form the opening to the first depth (D3) includes performing a first etch operation to form the opening into a portion of an ILD layer (e.g., a dielectric layer 210) of the one or more first dielectric layers, and performing a second etch operation to form the opening through the ILD layer and into a portion of an etch stop layer (e.g., an ESL 208) below the ILD layer.

In a third implementation, alone or in combination with one or more of the first and second implementations, etching the one or more first dielectric layers to form the opening to the first depth (D3) includes performing a pull-back operation to remove portions of the pattern 808, and performing, after the pull-back operation, a corner rounding operation to form an angled portion 810*b* of the opening above a straight portion 810*a* of the opening. In a fourth implementation, alone or in combination with one or more of the first through third implementations, the corner rounding operation and the dry ashing operation are performed in the same processing chamber 116 of the semiconductor processing tool (e.g., the etch tool 108).

In a fifth implementation, alone or in combination with one or more of the first through fourth implementations, etching the one or more second dielectric layers to increase the opening from the first depth (D3) to the second depth (D4) includes etching through the etch stop layer (e.g., the ESL 208) and through a dielectric capping layer 218 below the etch stop layer to extend the straight portion 810*a* of the opening to the top surface of the metal capping layer 216. In a sixth implementation, alone or in combination with one or more of the first through fifth implementations, process 1100 includes performing a wet cleaning operation for the semiconductor device 200 after the dry ashing operation and prior to etching the one or more second dielectric layers to increase the opening from the first depth (D3) to the second depth (D4). In a seventh implementation, alone or in combination with one or more of the first through sixth implementations, process 1100 includes performing another wet cleaning operation for the semiconductor device (200) after etching the one or more second dielectric layers to increase the opening from the first depth (D3) to the second depth (D4) and prior to forming the gate interconnect structure 224.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, the semiconductor processing techniques described herein increase the effectiveness of removing residual materials and/or native oxides in an opening in which an interconnect structure is to be formed for a semiconductor device. In some implementations, multiple dry etching operations are performed to form the opening, with a wet cleaning operation performed in between the dry etching operations. This multi-step etch approach increases the effectiveness of residual material removal, which increases the quality of the interconnect structure and reduces a likelihood of under etching, both of which increase semiconductor device yield and semiconductor device performance. Moreover, a dry ashing operation is performed (e.g., to remove photoresist layers and/or hard mask layers from the semiconductor device) in the same chamber as the first dry etching operation.

As described in greater detail above, some implementations described herein provide a method. The method includes forming, into one or more dielectric layers of a semiconductor device, an opening to a first depth over a gate structure of the semiconductor device, where the opening is formed to the first depth in one or more first etch operations. The method includes performing a wet cleaning operation after the one or more first etch operations to clean the opening. The method includes forming, after performing the wet cleaning operation, the opening to a second depth such that a top surface of a metal capping layer over the gate structure is exposed through the opening, where the second depth is greater than the first depth, and where the opening is formed to the second depth in a second etch operation. The method includes forming, in the opening and after forming the opening to the second depth, a gate interconnect structure on the metal capping layer over the gate structure.

As described in greater detail above, some implementations described herein provide a method. The method includes etching, based on a pattern in one or more pattering layers, one or more first dielectric layers of a semiconductor device to form an opening over a gate structure of the semiconductor device to a first depth. The method includes performing, after etching the one or more first dielectric layers, a dry ashing operation to remove the one or more patterning layers from the semiconductor device, where the dry ashing operation and etching the one or more first dielectric layers are performed in a same processing chamber of a semiconductor processing tool. The method includes etching, after performing the dry ashing operation, one or more second dielectric layers to increase the opening from the first depth to a second depth such that a top surface of a metal capping layer over the gate structure is exposed through the opening. The method includes forming, after increasing the opening from the first depth to the second depth, a gate interconnect structure in the opening over the metal capping layer.

As described in greater detail above, some implementations described herein provide a semiconductor device. The semiconductor device includes a substrate. The semiconductor device includes a fin structure extending above the substrate. The semiconductor device includes a gate structure over the fin structure. The semiconductor device includes a source/drain region in a portion of the fin structure and adjacent to the gate structure. The semiconductor device includes a gate interconnect structure above the gate structure and electrically connected with the gate structure, where the gate interconnect structure comprises: an approximately straight portion facing the gate structure, and an angled portion over the approximately straight portion. The semiconductor device includes a metal gate contact above the source/drain region and electrically connected with the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

etching, based on a pattern in one or more patterning layers, one or more first dielectric layers of a semiconductor device to form an opening over a gate structure of the semiconductor device to a first depth, wherein a bottommost surface of the opening at the first depth is a surface of an etch stop layer, and wherein the etch stop layer is disposed over a metal capping layer that is disposed over the gate structure;

performing, after etching the one or more first dielectric layers, a dry ashing operation to remove the one or more patterning layers from the semiconductor device, wherein the dry ashing operation and etching the one or more first dielectric layers are performed in a same processing chamber of a semiconductor processing tool;

etching, after performing the dry ashing operation, one or more second dielectric layers disposed on the metal capping layer to increase the opening from the first depth to a second depth such that an uppermost surface of the metal capping layer is exposed through the opening, wherein the bottommost surface of the opening at the second depth is the uppermost surface of the metal capping layer, and wherein the bottommost surface of the opening at the second depth is lower than the bottommost surface of the opening at the first depth; and forming, after increasing the opening from the first depth to the second depth, a gate interconnect structure in the opening over the metal capping layer.

2. The method of claim 1, further comprising:

forming the pattern through a photoresist layer of the one or more patterning layers;

forming the pattern through a first mask layer, of the one or more patterning layers, below the photoresist layer;

forming, using a first process gas combination, the pattern through a first portion of a second mask layer, of the one or more patterning layers, below the first mask layer; and forming, using a second process gas combination, the pattern through a second portion of the second mask layer below the first portion such that a top surface of a dielectric layer of the one or more first dielectric layers is exposed through the pattern, wherein the first process gas combination and the second process gas combination are different process gas combinations.

3. The method of claim 1, wherein etching the one or more first dielectric layers to form the opening to the first depth comprises:

performing a first etch operation to form the opening into a portion of an interlayer dielectric (ILD) layer of the one or more first dielectric layers; and performing a second etch operation to form the opening through the ILD layer and into a portion of the etch stop layer, wherein the etch stop layer is below the ILD layer.

4. The method of claim 3, wherein etching the one or more first dielectric layers to form the opening to the first depth comprises:

performing a pull-back operation to remove portions of the pattern; and performing, after the pull-back operation, a corner rounding operation to form an angled portion of the opening above a straight portion of the opening.

5. The method of claim 4, wherein the corner rounding operation and the dry ashing operation are performed in the same processing chamber of the semiconductor processing tool.

6. The method of claim 4, wherein etching the one or more second dielectric layers to increase the opening from the first depth to the second depth comprises:

etching through the etch stop layer and through a dielectric capping layer below the etch stop layer to extend the straight portion of the opening to the uppermost surface of the metal capping layer.

7. The method of claim 1, further comprising:

performing a wet cleaning operation for the semiconductor device after the dry ashing operation and prior to etching the one or more second dielectric layers to increase the opening from the first depth to the second depth.

8. The method of claim 7, further comprising:

performing another wet cleaning operation for the semiconductor device after etching the one or more second dielectric layers to increase the opening from the first depth to the second depth and prior to forming the gate interconnect structure.

9. A method, comprising:

performing a first dry etching operation on one or more first dielectric layers of a semiconductor device to form an opening to a first depth over a gate structure of the semiconductor device, wherein a bottommost surface of the opening at the first depth is a surface of an etch stop layer, and wherein the etch stop layer is disposed over a metal capping layer that is disposed over the gate structure;

performing a wet cleaning operation after the first dry etching operation to clean the opening;

performing, after the wet cleaning operation, a second dry etching operation on one or more second dielectric layers disposed on the metal capping layer to form the opening to a second depth such that an uppermost surface of the metal capping layer is exposed through the opening, wherein the bottommost surface of the opening at the second depth is the uppermost surface of the metal capping layer, and wherein the bottommost surface of the opening at the second depth is lower than the bottommost surface of the opening at the first depth; and forming, after performing the second dry etching operation, a gate interconnect structure in the opening over the metal capping layer.

10. The method of claim 9, further comprising:

performing another wet cleaning operation to clean the opening after the second dry etching operation and prior to forming the gate interconnect structure.

11. The method of claim 9, further comprising:

performing, after the first dry etching operation and before the wet cleaning operation, a dry ashing operation.

12. The method of claim 11, wherein the dry ashing operation and the first dry etching operation are performed in a same processing chamber.

13. The method of claim 9, wherein the bottommost surface of the opening at the first depth is formed by etching a portion of the etch stop layer.

14. The method of claim 9, wherein the bottommost surface of the opening at the first depth is formed by etching a portion of the etch stop layer.

15. The method of claim 9, wherein the first dry etching operation is a plasma-based dry etching operation.

16. A method, comprising:

forming a plurality of patterning layers over one or more first dielectric layers of a semiconductor device;

forming a pattern in the plurality of patterning layers;

performing, after forming the pattern, a first dry etching operation on the one or more first dielectric layers to form an opening to a first depth over a gate structure of the semiconductor device, wherein a bottommost surface of the opening at the first depth is a surface of an etch stop layer, and wherein the etch stop layer is disposed over a metal capping layer that is disposed over the gate structure;

performing a wet cleaning operation after the first dry etching operation to clean the opening;

performing, after the wet cleaning operation, a second dry etching operation on one or more second dielectric layers disposed on the metal capping layer to form the opening to a second depth such that an uppermost surface of the metal capping layer is exposed through the opening, wherein the bottommost surface of the opening at the second depth is the uppermost surface of the metal capping layer, and wherein the bottommost surface of the opening at the second depth is lower than the bottommost surface of the opening at the first depth; and forming, after performing the second dry etching operation, a gate interconnect structure in the opening over the metal capping layer.

17. The method of claim 16, further comprising:

performing another wet cleaning operation to clean the opening after the second dry etching operation and prior to forming the gate interconnect structure.

18. The method of claim 16, further comprising:

performing, after the first dry etching operation and before the wet cleaning operation, a dry ashing operation.

19. The method of claim 18, wherein the dry ashing operation and the first dry etching operation are performed in a same processing chamber.

20. The method of claim 18, wherein the dry ashing operation is performed to remove the plurality of patterning layers.

* * * * *